US012796289B2

(12) United States Patent
Kim et al.

(10) Patent No.: US 12,796,289 B2
(45) Date of Patent: Nov. 10, 2026

(54) DISPLAY APPARATUS AND METHOD OF MANUFACTURING THE DISPLAY APPARATUS

(71) Applicant: SAMSUNG DISPLAY CO., LTD., Yongin-si (KR)

(72) Inventors: Kyungmin Kim, Yongin-si (KR); Junhyeong Park, Yongin-si (KR); Hosik Shin, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 437 days.

(21) Appl. No.: 18/225,624

(22) Filed: Jul. 24, 2023

(65) Prior Publication Data

US 2024/0032393 A1 Jan. 25, 2024

(30) Foreign Application Priority Data

Jul. 25, 2022 (KR) ........................ 10-2022-0092060

(51) Int. Cl.
*H10K 59/80* (2023.01)
*H10K 71/00* (2023.01)
*H10K 102/00* (2023.01)

(52) U.S. Cl.
CPC ........... *H10K 59/873* (2023.02); *H10K 71/00* (2023.02); *H10K 2102/351* (2023.02)

(58) Field of Classification Search
CPC . H10K 59/873; H10K 71/00; H10K 2102/351
See application file for complete search history.

(56) References Cited

U.S. PATENT DOCUMENTS 10,522,783 B2 12/2019 Jo et al.
11,258,044 B2 2/2022 Kwon et al.
2013/0026503 A1 1/2013 Son et al.
2015/0195915 A1 7/2015 Namkung
2021/0011202 A1 1/2021 Kwon et al.
2021/0127517 A1 * 4/2021 Kim ......................... H05K 5/03
2022/0085342 A1 3/2022 Kim et al.
2022/0102462 A1 3/2022 Zhou et al.
2022/0216276 A1 7/2022 Lee et al.
2023/0130999 A1 * 4/2023 Lee ...................... H10K 50/841 257/680

FOREIGN PATENT DOCUMENTS

CN 112133733 A 12/2020
KR 20130014111 A 2/2013
KR 20150123599 A 11/2015
KR 1020180036286 4/2018
KR 1020210002172 1/2021
KR 1020210006562 1/2021
KR 102283589 7/2021
KR 20220037548 A 3/2022
KR 20220099157 A 7/2022

* cited by examiner

*Primary Examiner* — Anne M Hines
(74) *Attorney, Agent, or Firm* — CANTOR COLBURN LLP

(57) ABSTRACT

A display apparatus includes a display panel including a central area and a corner area in a corner of the central area, and a resin layer disposed on the display panel. The corner area includes a plurality of extension areas extending in a direction away from the central area, and a separation area between the plurality of extension areas, and the resin layer includes a plurality of resin layer extension areas respectively overlapping the plurality of extension areas.

10 Claims, 20 Drawing Sheets

DISPLAY APPARATUS AND METHOD OF MANUFACTURING THE DISPLAY APPARATUS

This application claims priority to Korean Patent Application No. 10-2022-0092060, filed on Jul. 25, 2022, and all the benefits accruing therefrom under 35 U.S.C. § 119, the content of which in its entirety is herein incorporated by reference.

BACKGROUND

1. Field

Embodiments relate to a display apparatus and a method of manufacturing the display apparatus, and more particularly, to a display apparatus in which defects may be prevented from occurring, and a method of manufacturing the display apparatus.

2. Description of the Related Art

Recently, electronic devices are being widely used. Electronic devices are used in various ways, such as mobile electronic devices and fixed electronic devices, and these electronic devices include a display apparatus providing a user with visual information, such as images or videos, to support various functions.

Recently, as a size of other components for driving a display apparatus is being reduced, a proportion of the display apparatus in an electronic device is being gradually increased, and a structure that may be bent by a predetermined angle from a flat state or folded around an axis is also being developed.

SUMMARY

In a display apparatus capable of being bent by a predetermined angle, a crack may be generated in the display apparatus, e.g., a display panel, during a process of bending the display apparatus.

Embodiments include a display apparatus in which defects may be prevented from occurring, and a method of manufacturing the display apparatus.

However, these problems are exemplary, and the scope of the disclosure is not limited thereto.

Additional features will be set forth in part in the description which follows and, in part, will be apparent from the description, or may be learned by practice of the presented embodiments of the disclosure.

In an embodiment of the disclosure, a display apparatus includes a display panel including a central area and a corner area in a corner of the central area, and a resin layer disposed on the display panel. The corner area includes a plurality of extension areas extending in a direction away from the central area, and a separation area between the plurality of extension areas, and the resin layer includes a plurality of resin layer extension areas respectively overlapping the plurality of extension areas.

In the embodiment, the resin layer may have a modulus of about 0.8 gigapascal (GPa) or more and about 1.5 GPa or less.

In the embodiment, the display panel further may include first corner dams respectively at opposite end portions of each of the plurality of extension areas in a width direction of an extension area of the plurality of extension areas, and the resin layer may be between the first corner dams.

In the embodiment, the resin layer may have a convex thickness between the first corner dams.

In the embodiment, the display panel may further include a display element, an encapsulation layer covering the display element and including an inorganic encapsulation layer and an organic encapsulation layer, and two second corner dams between the first corner dams respectively at the opposite end portions of each of the plurality of extension areas in the width direction of an extension area of the plurality of extension areas. The organic encapsulation layer may be between the two second corner dams.

In the embodiment, the organic encapsulation layer and the resin layer may overlap each other between the two second corner dams in a plan view.

In the embodiment, the organic encapsulation layer and the resin layer may not overlap each other between each of the first corner dams and each of the two second corner dams.

In the embodiment, a thickness of the resin layer may be about 70 micrometers (μm) or more and about 110 μm or less.

In the embodiment, the resin layer may include a transparent material.

In the embodiment, the display apparatus may further include a cover window disposed on the resin layer, and an adhesive layer between the resin layer and the cover window. The cover window and the adhesive layer may overlap the separation area, and the resin layer may not overlap the separation area.

In an embodiment of the disclosure, a method of manufacturing a display apparatus includes forming a substrate on a support substrate, the substrate including a central area, and a corner area arranged in a corner of the central area and including a plurality of extension areas each extending in a direction away from the central area, forming a display element on the substrate, forming an encapsulation layer to cover the display element, and forming a resin layer having a modulus of about 0.8 GPa or more and about 1.5 GPa or less on the encapsulation layer.

In the embodiment, the forming the resin layer may include forming the resin layer in the plurality of extension areas in a plan view.

In the embodiment, the forming the resin layer may further include coating a resin in a droplet state.

In the embodiment, the method may further include forming first corner dams on the substrate respectively at opposite end portions of each of the plurality of extension areas in a width direction of the extension area. The resin layer may be between the first corner dams.

In the embodiment, the method may further include forming two second corner dams between the first corner dams respectively at the opposite end portions of each of the plurality of extension areas in the width direction of the extension area. The forming the encapsulation layer may include arranging an organic encapsulation layer between the two second corner dams, and the resin layer may not overlap the organic encapsulation layer between each of the first corner dams and each of the two second corner dams.

In the embodiment, the method may further include at least partially removing the substrate in a separation area defined between the plurality of extension areas.

In the embodiment, the method may further include detaching the substrate from the support substrate, bending the plurality of extension areas, and disposing a cover window on the resin layer in the plurality of extension areas.

In the embodiment, the method may further include arranging an adhesive layer between the cover window and the resin layer. The cover window and the adhesive layer may overlap the separation area, and the resin layer may not overlap the separation area.

In the embodiment, a thickness of the resin layer may be about 70 μm or more and about 110 μm or less.

In the embodiment, the resin layer may include a transparent material.

Other features and advantages other than those described above will now become apparent from the following drawings, claims, and the detailed description of the disclosure.

BRIEF DESCRIPTION OF THE DRAWINGS

The above and other features and advantages of illustrative embodiments of the disclosure will be more apparent from the following description taken in conjunction with the accompanying drawings, in which.

DETAILED DESCRIPTION

Figure 1:
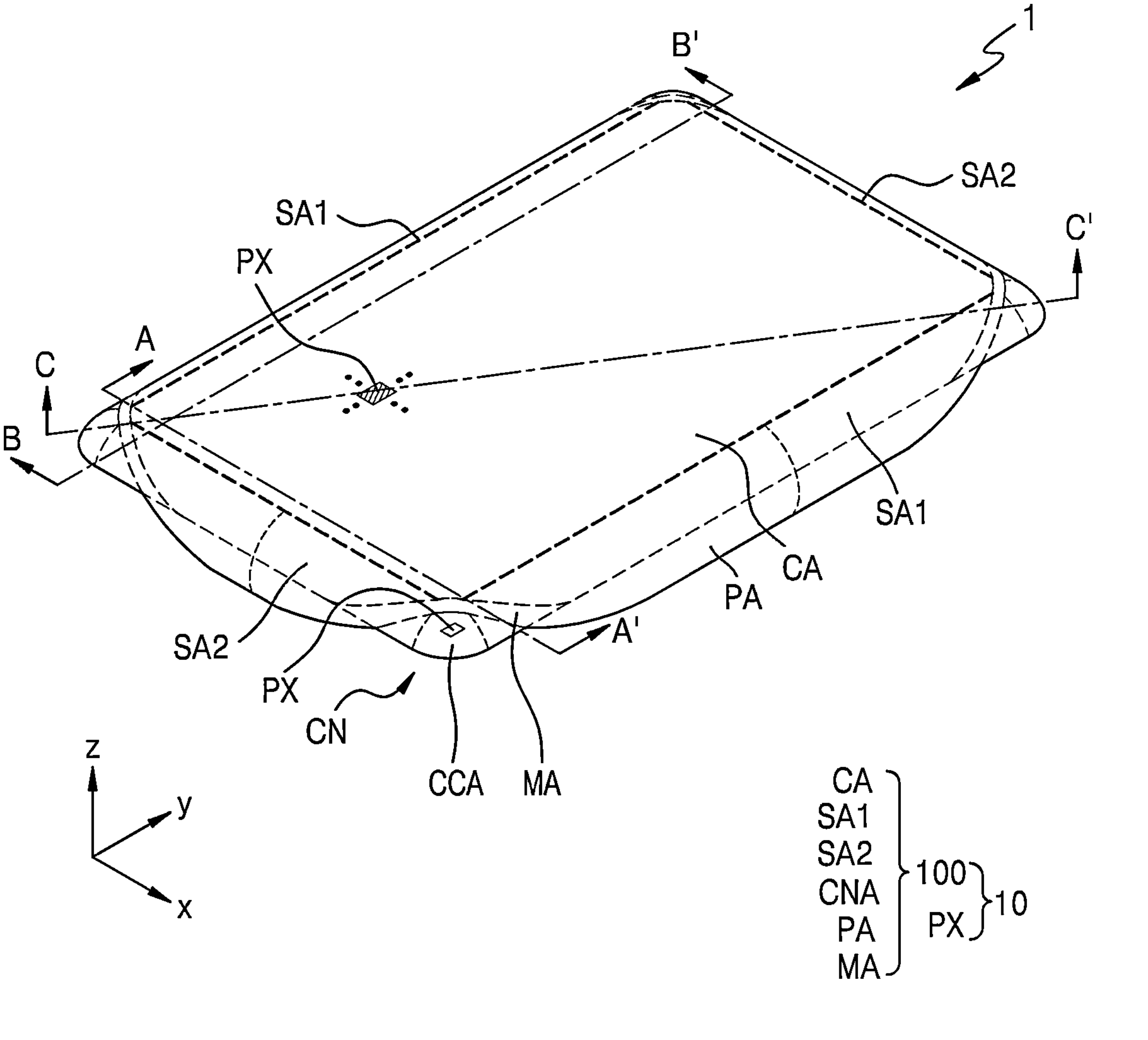
FIG. 1 is a perspective view schematically illustrating an embodiment of a display apparatus.

Reference will now be made in detail to embodiments, illustrative embodiments of which are illustrated in the accompanying drawings, where like reference numerals refer to like elements throughout. In this regard, the illustrated embodiments may have different forms and should not be construed as being limited to the descriptions set forth herein. Accordingly, the embodiments are merely described below, by referring to the drawing figures, to explain features of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, particular embodiments will be illustrated in the drawings and described in detail in the written description. Effects and features of the disclosure and methods of achieving the same will be apparent with reference to embodiments and drawings described below in detail. The disclosure may, however, be embodied in many different forms and should not be construed as being limited to the embodiments set forth herein.

The disclosure will now be described more fully with reference to the accompanying drawings, in which embodiments of the disclosure are shown. Like reference numerals in the drawings denote like elements, and thus their description will be omitted.

In the following embodiments, while such terms as "first," "second," etc., may be used to describe various elements, such elements must not be limited to the above terms.

In the following embodiments, an expression used in the singular encompasses the expression of the plural, unless it has a clearly different meaning in the context.

In the following embodiments, it is to be understood that the terms such as "including" and "having" are intended to indicate the existence of the features, or elements disclosed in the disclosure, and are not intended to preclude the possibility that one or more other features or elements may exist or may be added.

It will be understood that when a layer, region, or component is referred to as being formed on another layer, region, or component, it can be directly or indirectly formed on the other layer, region, or component. That is, for example, intervening layers, regions, or components may be present.

Sizes of components in the drawings may be exaggerated for convenience of explanation. Since sizes and thicknesses of components in the drawings are arbitrarily illustrated for convenience of explanation, for example, the following the disclosure is not limited thereto.

The x, y, and z axes are not limited to three axes of an orthogonal coordinates system, and may be interpreted in a broad sense. The x-axis, the y-axis, and the z-axis may be perpendicular to one another, or may represent different directions that are not perpendicular to one another, for example.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term “about” can mean within one or more standard deviations, or within ±30%, 20%, 10%, 5% of the stated value, for example.

When an illustrative embodiment may be implemented differently, a predetermined process order may be performed differently from the described order. Two consecutively described processes may be performed substantially at the same time or performed in an order opposite to the described order.

In the disclosure, a display apparatus is an apparatus which displays a video or a still image, which may be a portable electronic device, such as a mobile phone, a smart phone, a tablet personal computer, a mobile communication terminal, an electronic notebook, an electronic book, a portable multimedia player (“PMP”), a navigation device, an ultra-mobile personal computer (“UMPC”), or the like, and may also be used as a display screen of various products, such as a television, a laptop computer, a monitor, an advertisement board, an Internet of things (“IoT”) device, or the like. In addition, a display apparatus in an embodiment may be used as a wearable device, such as a smart watch, a watch phone, a glasses-type display, and a head-mounted display (“HMD”). In addition, the display apparatus in an embodiment may be used as a dashboard of a vehicle, a center fascia of a vehicle or a center information display (“CID”) disposed on a dashboard, a room mirror display replacing a side mirror of a vehicle, and a display arranged on a back surface of a front seat as entertainment for a back seat of a vehicle.

Sizes of components in the drawings may be exaggerated for convenience of explanation. Since sizes and thicknesses of components in the drawings are arbitrarily illustrated for convenience of explanation, for example, the following the disclosure is not limited thereto.

Figure 2A:
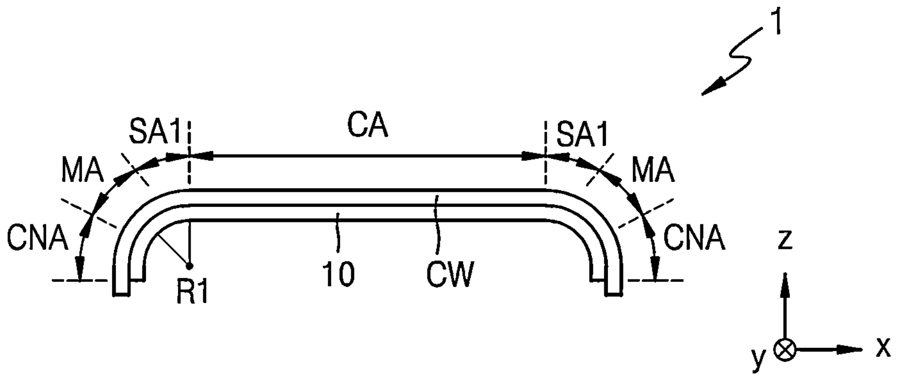
FIG. 2A is a cross-sectional view of the display apparatus of FIG. 1 taken along line A-A'.
Figure 2B:
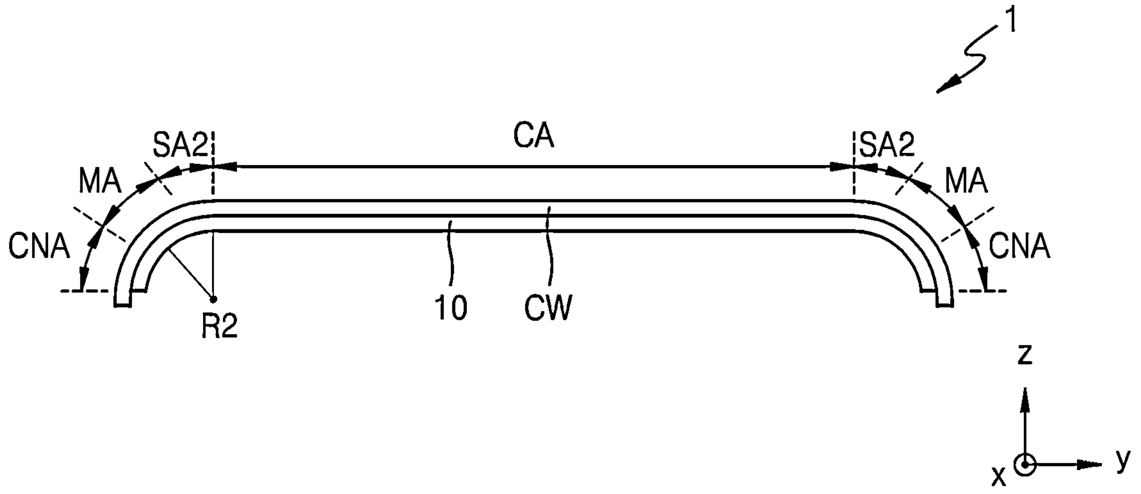
FIG. 2B is a cross-sectional view of the display apparatus of FIG. 1 taken along line B-B'.
Figure 2C:
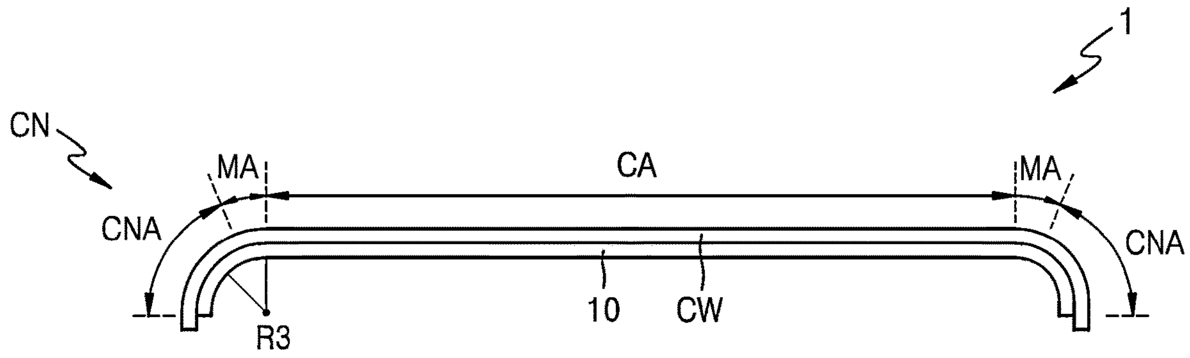
FIG. 2C is a cross-sectional view of the display apparatus of FIG. 1 taken along line C-C'.

FIG. 1 is a perspective view schematically illustrating an embodiment of a display apparatus 1, FIG. 2A is a cross-sectional view of the display apparatus 1 of FIG. 1 taken along line A-A', FIG. 2B is a cross-sectional view of the display apparatus 1 of FIG. 1 taken along line B-B', and FIG. 2C is a cross-sectional view of the display apparatus 1 of FIG. 1 taken along line C-C'.

Referring to FIGS. 1 and 2A to 2C, the display apparatus 1 may display an image. The display apparatus 1 may include an edge in a first direction and an edge in a second direction. Here, the first direction and the second direction may be directions intersecting with each other. In an embodiment, the first direction and the second direction may define an acute angle with each other, for example. In another embodiment, the first direction and the second direction may define an obtuse angle with each other, or may be orthogonal to each other. Hereinafter, a case where the first direction and the second direction are orthogonal to each other is mainly described in detail. In an embodiment, the first direction may be an x direction or −x direction, and the second direction may be a y direction or −y direction, for example.

In an embodiment, a corner CN where the edge in the first direction (e.g., the x direction or −x direction of FIG. 1) and the edge in the second direction (e.g., the y direction or −y direction of FIG. 1) meet each other may have a predetermined curvature.

The display apparatus 1 may include a cover window CW and a display panel 10. The cover window CW may protect the display panel 10. In an embodiment, the cover window CW may be disposed on the display panel 10. In an embodiment, the cover window CW may be a flexible window. The cover window CW may protect the display panel 10 while being easily bent by an external force without occurrence of cracks or the like. The cover window CW may include glass, sapphire, or plastic. The cover window CW may be ultra-thin glass or colorless polyimide (“CPI”), for example. In an embodiment, the cover window CW may have a structure in which a flexible polymer layer is disposed on one surface of a glass substrate, or may only include a polymer layer.

The display panel 10 may be disposed below the cover window CW. Although not illustrated in the drawings, the display panel 10 may be attached to the cover window CW by a transparent adhesive member, such as an optically clear adhesive (“OCA”) film.

The display panel 10 may display an image. The display panel 10 may include a substrate 100 and a pixel PX. The substrate 100 may include a central area CA, a first side surface area SA1, a second side surface area SA2, a corner area CNA, a middle area MA, and a peripheral area PA. In an embodiment, the shape of the substrate 100 may define the shape of the display apparatus 1.

The central area CA may be a flat area. In an embodiment, the display apparatus 1 may provide most of the images in the central area CA.

The first side surface area SA1 may be adjacent to the central area CA in the first direction (e.g., the x direction or −x direction of FIG. 1) and may be bent. The first side surface area SA1 may be defined as an area bent from the central area CA in a cross-section (e.g., an xz cross-section) in the first direction (e.g., the x direction or −x direction). The first side surface area SA1 may extend in the second direction (e.g., the y direction or −y direction). In other words, the first side surface area SA1 may not be bent in a cross-section (e.g., a yz cross-section) in the second direction (e.g., the y direction or −y direction). The first side surface area SA1 may extend from the central area CA in the first direction (e.g., the x direction or −x direction). FIG. 2A illustrates that the first side surface area SA1 extending and bent from the central area CA in the x direction and the first side surface area SA1 extending and bent from the central area CA in the −x direction have the same curvature, but in another embodiment, the first side surface area SA1 extending and bent from the central area CA in the x direction and the first side surface area SA1 extending and bent from the central area CA in the −x direction may have different curvatures from each other.

The second side surface area SA2 may be adjacent to the central area CA in the second direction (e.g., the y direction or −y direction) and may be bent. The second side surface area SA2 may be defined as an area bent from the central area CA in a cross-section (e.g., the yz cross-section) in the second direction (e.g., the y direction or −y direction). The second side surface area SA2 may extend in the first direction (e.g., the x direction or −x direction). The second side surface area SA2 may not be bent in a cross-section (e.g., the xz cross-section) orthogonal to the first direction (e.g., the x direction or −x direction). FIG. 2B illustrates that the second side surface area SA2 extending and bent from the central area CA in the y direction and the second side surface area SA2 extending and bent from the central area CA in the −y direction have the same curvature, but in another embodiment, the second side surface area SA2 extending and bent from the central area CA in the y direction and the second side surface area SA2 extending and bent from the central area CA in the −y direction may have different curvatures from each other.

The corner area CNA may be an area arranged in the corner CN. In an embodiment, the corner area CNA may be an area where the edge of the display apparatus 1 in the first direction (e.g., the x direction or −x direction) and the edge of the display apparatus 1 in the second direction (e.g., the y direction or −y direction) meet each other. In an embodiment, the corner area CNA may at least partially surround the central area CA, the first side surface area SA1, and the second side surface area SA2. In an alternative embodiment, the corner area CNA may at least partially surround the central area CA, the first side surface area SA1, the second side surface area SA2, and the middle area MA. When the first side surface area SA1 extends and is bent in the first direction (e.g., the x direction or −x direction), and the second side surface area SA2 extends and is bent in the second direction (e.g., the y direction or −y direction), at least a portion of the corner area CNA may extend and be bent in the second direction (e.g., the y direction or −y direction) while extending and being bent in the first direction (e.g., the x direction or −x direction). In other words, at least a portion of the corner area CNA may be a double curved area in which a plurality of curvatures in a plurality of directions overlap each other. In an embodiment, a plurality of corner areas CNA may be provided.

The middle area MA may be between the central area CA and the corner area CNA. In an embodiment, the middle area MA may extend between the first side surface area SA1 and the corner area CNA. In an embodiment, the middle area MA may extend between the second side surface area SA2 and the corner area CNA. In an embodiment, the middle area MA may be bent. A driving circuit which provides an electrical signal to the pixel PX and/or a power supply line which provides power may be arranged in the middle area MA. In this case, the pixel PX arranged in the middle area MA may overlap the driving circuit and/or the power supply line. In some embodiments, the driving circuit and/or the power supply line in the middle area MA may be omitted.

The peripheral area PA may be outside the central area CA. In an embodiment, the peripheral area PA may be outside the first side surface area SA1. The peripheral area PA may extend from the first side surface area SA1. In an embodiment, the peripheral area PA may be outside the second side surface area SA2. The peripheral area PA may extend from the second side surface area SA2. The pixel PX may not be arranged in the peripheral area PA. Accordingly, the peripheral area PA may be a non-display area that does not display an image. A driving circuit which provides an electrical signal to the pixel PX and/or a power supply line which provides power may be arranged in the peripheral area PA.

Referring to FIG. 2A, a portion of the first side surface area SA1, a portion of the middle area MA, and a portion of the corner area CNA may have a first radius of curvature R1 and may be bent. Referring to FIG. 2B, a portion of the second side surface area SA2, another portion of the middle area MA, and another portion of the corner area CNA may have a second radius of curvature R2 and may be bent. Referring to FIG. 2C, another portion of the middle area MA and another portion of the corner area CNA may have a third radius of curvature R3 and may be bent.

The pixel PX may be disposed on the substrate 100. In an embodiment, a plurality of pixels PX may be provided, and the plurality of pixels PX may display images by emitting light. In an embodiment, the plurality of pixels PX may each include a red sub-pixel, a green sub-pixel, and a blue sub-pixel. In an alternative embodiment, the plurality of pixels PX may each include a red sub-pixel, a green sub-pixel, a blue sub-pixel, and a white sub-pixel.

The pixel PX may be arranged in at least one of the central area CA, the first side surface area SA1, the second side surface area SA2, and the corner area CNA. In an embodiment, the plurality of pixels PX may be arranged in the central area CA, the first side surface area SA1, the second side surface area SA2, the corner area CNA, and the middle area MA. In this case, the display apparatus 1 may display an image in the central area CA, the first side surface area SA1, the second side surface area SA2, the corner area CNA, and the middle area MA. In an embodiment, the plurality of pixels PX arranged in the central area CA, the first side surface area SA1, the second side surface area SA2, the corner area CNA, and the middle area MA may provide independent images, respectively. In another embodiment, the plurality of pixels PX arranged in the central area CA, the first side surface area SA1, the second side surface area SA2, the corner area CNA, and the middle area MA may respectively provide portions of any one image.

The display apparatus 1 may display an image not only in the central area CA but also in the first side surface area SA1, the second side surface area SA2, the middle area MA, and the corner area CNA. Accordingly, the proportion of a display area of the display apparatus 1, the display area being an area for displaying an image, may increase. In addition, because the display apparatus 1 may be bent in the corner CN and display an image in the corner CN, the aesthetics of the display apparatus 1 may be improved.

Figure 3:
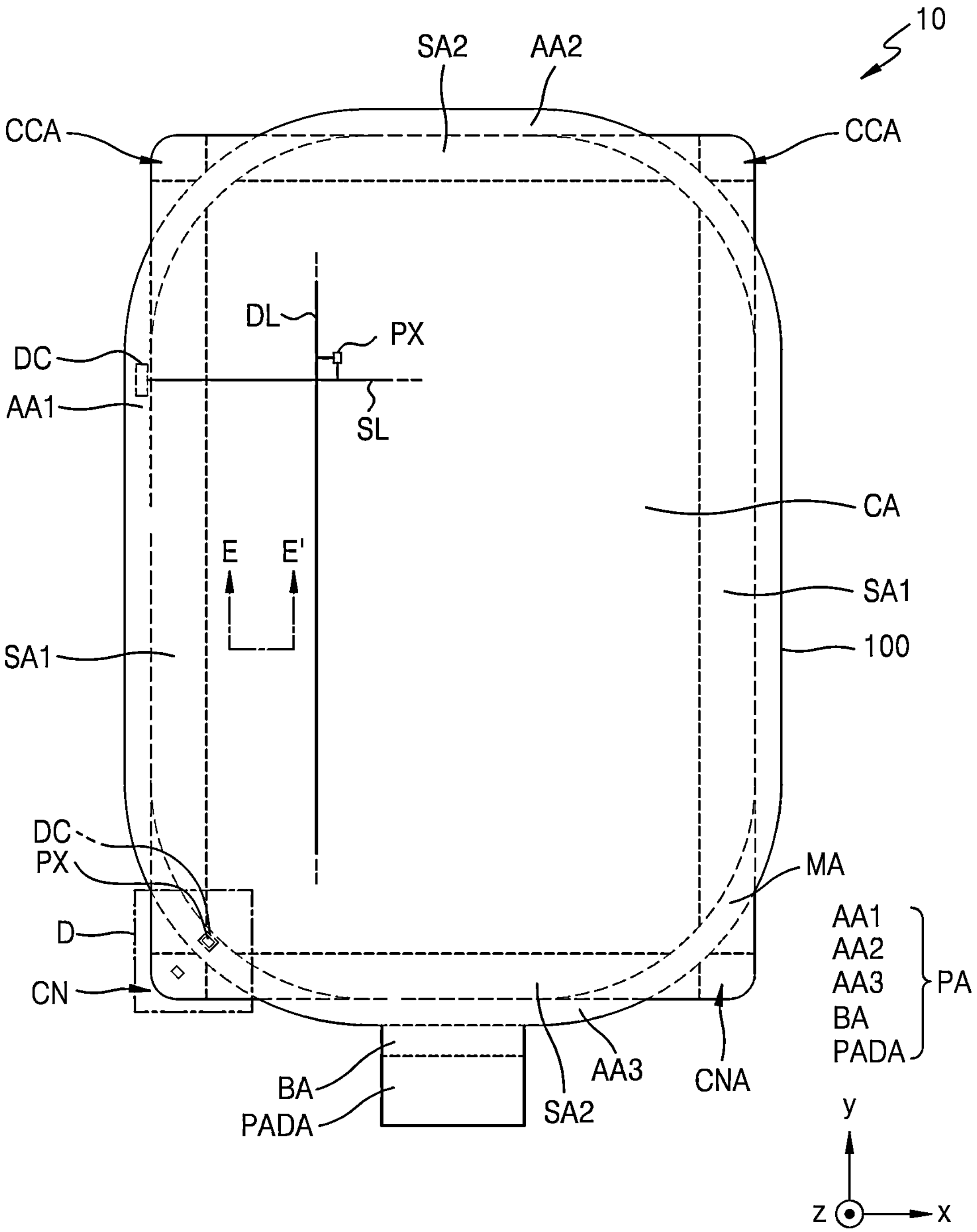
FIG. 3 is a plan view schematically illustrating an embodiment of a display panel.

FIG. 3 is a plan view schematically illustrating an embodiment of the display panel 10.

Referring to FIG. 3, the display panel 10 may display an image. The display panel 10 may include the substrate 100, the pixel PX, and a driving circuit DC. The substrate 100 may include the central area CA, the first side surface area SA1, the second side surface area SA2, the corner area CNA, the middle area MA, and the peripheral area PA. The central area CA may be a flat area. In an embodiment, the display panel 10 may provide most of the images in the central area CA.

The first side surface area SA1 may be adjacent to the central area CA in a first direction (e.g., an x direction or −x direction). In an embodiment, the first side surface area SA1 may be between the central area CA and the peripheral area PA. The first side surface area SA1 may extend from the central area CA in the first direction (e.g., the x direction or −x direction).

The second side surface area SA2 may be adjacent to the central area CA in a second direction (e.g., a y direction or −y direction). In an embodiment, the second side surface area SA2 may be between the central area CA and the peripheral area PA. The second side surface area SA2 may extend from the central area CA in the second direction (e.g., the y direction or −y direction).

The corner area CNA may be an area arranged in a corner CN of the display panel 10. In an embodiment, the corner area CNA may be an area where an edge of the display panel 10 in the first direction (e.g., the x direction or −x direction) and an edge of the display panel 10 in the second direction (e.g., the y direction or −y direction) meet each other. In an embodiment, the corner area CNA may at least partially surround the central area CA, the first side surface area SA1, and the second side surface area SA2. The corner area CNA may at least partially surround the central area CA, the first side surface area SA1, the second side surface area SA2, and the middle area MA.

The middle area MA may be between the central area CA and the corner area CNA. In an embodiment, the middle area MA may extend between the first side surface area SA1 and the corner area CNA. In an embodiment, the middle area MA may extend between the second side surface area SA2 and the corner area CNA. The driving circuit DC which provides an electrical signal to the pixel PX and/or a power supply line which provides power may be arranged in the middle area MA. In this case, the pixel PX arranged in the middle area MA may overlap the driving circuit DC and/or the power supply line. In some embodiments, the driving circuit DC and/or the power supply line arranged in the middle area MA may be omitted.

The peripheral area PA may be outside the central area CA. The pixel PX may not be arranged in the peripheral area PA. Accordingly, the peripheral area PA may be a non-display area that does not display an image. The driving circuit DC which provides an electrical signal to the pixel PX and/or a power supply line which provides power may be arranged in the peripheral area PA. The peripheral area PA may include a first adjacent area AA1, a second adjacent area AA2, a third adjacent area AA3, a bending area BA, and a pad area PADA.

The first adjacent area AA1 may be outside the first side surface area SA1. In other words, the first side surface area SA1 may be between the first adjacent area AA1 and the central area CA. The first adjacent area AA1 may extend from the first side surface area SA1. In an embodiment, the first adjacent area AA1 may extend from the first side surface area SA1 in the first direction (e.g., the x direction or −x direction). In an embodiment, the driving circuit DC may be arranged in the first adjacent area AA1.

The second adjacent area AA2 and the third adjacent area AA3 may each be outside the second side surface area SA2. In other words, the second side surface area SA2 may be between the second adjacent area AA2 and the central area CA. In addition, the second side surface area SA2 may be between the third adjacent area AA3 and the central area CA. The second adjacent area AA2 and the third adjacent area AA3 may each extend from the second side surface area SA2. In an embodiment, the second adjacent area AA2 and the third adjacent area AA3 may each extend in the second direction (e.g., the y direction or −y direction). The central area CA may be between the second adjacent area AA2 and the third adjacent area AA3.

The bending area BA may be outside the third adjacent area AA3. In other words, the third adjacent area AA3 may be between the bending area BA and the second side surface area SA2. The display panel 10 may be bent in the bending area BA. In this case, the pad area PADA may face a rear surface of the display panel 10, which is opposite to an upper surface thereof on which an image is displayed. Accordingly, the area of the peripheral area PA visible to a user may be reduced.

The pad area PADA may be outside the bending area BA. In other words, the bending area BA may be between the third adjacent area AA3 and the pad area PADA. A pad (not shown) may be arranged in the pad area PADA. The display panel 10 may receive an electrical signal and/or power voltage through the pad.

At least one of the first side surface area SA1, the second side surface area SA2, the corner area CNA, and the middle area MA may be bent. In an embodiment, a portion of the first side surface area SA1 and a portion of the corner area CNA may be bent in a cross-section (e.g., an xz cross-section) in the first direction (e.g., the x direction or −x direction), for example. A portion of the second side surface area SA2 and another portion of the corner area CNA may be bent in a cross-section (e.g., a yz cross-section) in the second direction (e.g., the y direction or −y direction). Another portion of the corner area CNA may be bent in a cross-section (e.g., the xz cross-section) in the first direction (e.g., the x direction or −x direction), and may be bent in a cross-section (e.g., the yz cross-section) in the second direction (e.g., the y direction or −y direction).

When the corner area CNA is bent, a compressive strain greater than a tensile strain may occur in the corner area CNA. In this case, it is desired to apply the substrate 100, which is contractible, and a multi-layered film structure on the substrate 100 to at least a portion of the corner area CNA. In an embodiment, the structure of the display panel 10 in the corner area CNA may be different from the structure of the display panel 10 in the central area CA.

The pixel PX and the driving circuit DC may be disposed on the substrate 100. The pixel PX may be arranged in at least one of the central area CA, the first side surface area SA1, the second side surface area SA2, the corner area CNA, and the middle area MA. In an embodiment, a plurality of pixels PX may be provided. The pixel PX may include a display element. In an embodiment, the display element may be an organic light-emitting diode including an organic emission layer. In an alternative embodiment, the display element may be a light-emitting diode ("LED") including an inorganic emission layer. The size of an LED may be in a micro scale or a nano scale. In an embodiment, the LED may be a micro-LED, for example. In an alternative embodiment, the LED may be a nanorod LED. The nanorod LED may include gallium nitride (GaN). In an embodiment, a color converting layer may be disposed above the nanorod LED. The color converting layer may include quantum dots. In an alternative embodiment, the display element may be a quantum dot light-emitting diode including a quantum dot emission layer.

The pixel PX may include a plurality of sub-pixels, and each of the plurality of sub-pixels may emit light of a predetermined color using a display element. In the disclosure, a sub-pixel is a minimum unit for realizing an image and refers to an emission area. When an organic light-emitting diode is used as a display element, the emission area may be defined by an opening of a pixel defining layer. This will be described below.

The driving circuit DC may be a scan driving circuit that provides a scan signal to each pixel PX through a scan line SL. In an alternative embodiment, the driving circuit DC may be a data driving circuit that provides a data signal to each pixel PX through a data line DL. In an embodiment, the data driving circuit may be arranged in the third adjacent area AA3 or in the pad area PADA. In an alternative embodiment, the data driving circuit may be disposed above a display circuit board connected thereto through the pad.

Figure 4:
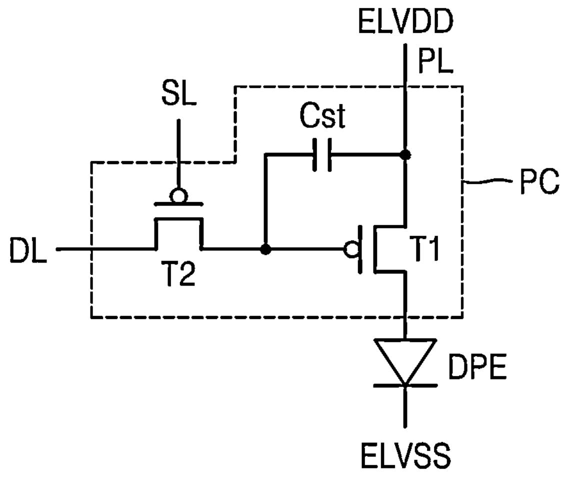
FIG. 4 is an equivalent circuit diagram schematically illustrating a pixel circuit applicable to a display panel.

FIG. 4 is an equivalent circuit diagram schematically illustrating a pixel circuit PC applicable to a display panel.

Referring to FIG. 4, the pixel circuit PC may be electrically connected to a display element DPE. The pixel circuit PC may include a first thin-film transistor T1, a second thin-film transistor T2, and a storage capacitor Cst. In an embodiment, the display element DPE may emit red, green, or blue light, or may emit red, green, blue, or white light.

The second thin-film transistor T2 may be connected to a scan line SL and a data line DL, and provide, to the first thin-film transistor T1, a data signal or a data voltage input to the data line DL, based on a scan signal or a switching voltage input to the scan line SL.

The storage capacitor Cst may be connected to the second thin-film transistor T2 and a driving voltage line PL and store a voltage corresponding to a difference between a voltage received from the second thin-film transistor T2 and a first power supply voltage ELVDD supplied to the driving voltage line PL.

The first thin-film transistor T1 may be connected to the driving voltage line PL and the storage capacitor Cst, and may control a driving current flowing from the driving voltage line PL to the display element DPE, in accordance to a voltage value stored in the storage capacitor Cst. The display element DPE may emit light having a predetermined brightness according to the driving current. An opposite electrode of the display element DPE may supply a second power supply voltage ELVSS.

Although FIG. 4 illustrates that the pixel circuit PC includes two thin-film transistors and one storage capacitor, the pixel circuit PC may include more thin-film transistors and/or storage capacitors.

Figure 5:
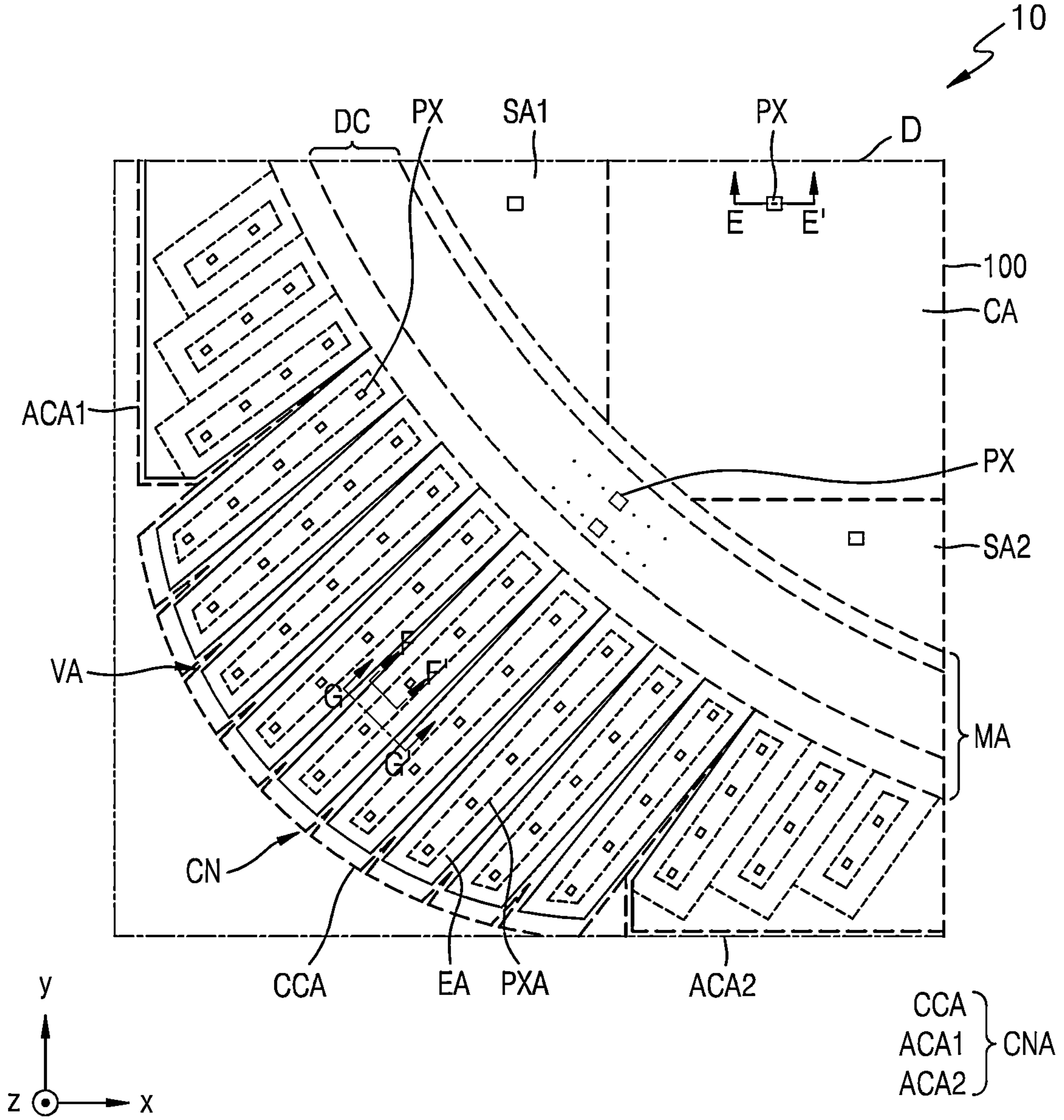
FIG. 5 is an enlarged view of a region D of the display panel of FIG. 3.

FIG. 5 is an enlarged view of a region D of the display panel 10 of FIG. 3.

Referring to FIG. 5, the substrate 100 may include the central area CA, the first side surface area SA1, the second side surface area SA2, and the corner area CNA.

The first side surface area SA1 may be adjacent to the central area CA in the first direction (e.g., the x direction or −x direction). The first side surface area SA1 may extend from the central area CA in the first direction (e.g., the x direction or −x direction). The second side surface area SA2 may be adjacent to the central area CA in the second direction (e.g., the y direction or −y direction). The second side surface area SA2 may extend from the central area CA in the second direction (e.g., the y direction or −y direction).

The corner area CNA may be an area arranged in the corner CN of the display panel 10. In an embodiment, the corner area CNA may be an area where an edge of the display panel 10 in the first direction (e.g., the x direction or −x direction) and an edge of the display panel 10 in the second direction (e.g., the y direction or −y direction) meet each other. In an embodiment, the corner area CNA may at least partially surround the central area CA, the first side surface area SA1, and the second side surface area SA2. The corner area CNA may at least partially surround the central area CA, the first side surface area SA1, the second side surface area SA2, and the middle area MA. The corner area CNA may include a central corner area CCA, a first adjacent corner area ACA1, and a second adjacent corner area ACA2.

The central corner area CCA may include an extension area EA. The extension area EA may extend in a direction away from the central area CA. A plurality of extension areas EA may be provided. Each of the plurality of extension areas EA may extend in a direction away from the central area CA. In an embodiment, the plurality of extension areas EA may extend in a direction crossing the first direction (e.g., the x direction or −x direction) and the second direction (e.g., the y direction or −y direction), for example.

A separation area VA may be defined between adjacent extension areas EA. The separation area VA may be an area in which components of the display panel 10 are not arranged. When the central corner area CCA is bent in the corner CN, a compressive strain greater than a tensile strain may occur in the central corner area CCA. However, the separation area VA is defined between adjacent extension areas EA, and thus, the display panel 10 may be bent without being damaged in the central corner area CCA.

The first adjacent corner area AGA1 may be adjacent to the central corner area CCA. At least a portion of the first side surface area SA1 and the first adjacent corner area AGA1 may be disposed in the first direction (e.g., the x direction or −x direction). An end portion of the first adjacent corner area AGA1 in a direction of the central corner area CCA may be spaced apart from an end portion of the central corner area CCA in a direction of the first adjacent corner area ACA1. The first adjacent corner area AGA1 may appear to be bent in a cross-section (zx cross-section) in the first direction and not to be bent in a cross-section (yz cross-section) in the second direction. The separation area VA may not be defined in the first adjacent corner area ACA1.

The second adjacent corner area ACA2 may overlap the central corner area CCA. At least a portion of the second side surface area SA2 and the second adjacent corner area ACA2 may be disposed in the second direction (y direction or −y direction). An end portion of the second adjacent corner area ACA2 in the direction of the central corner area CCA may be spaced apart from an end portion of the central corner area CCA in a direction of the second adjacent corner area ACA2. The second adjacent corner area ACA2 may appear not to be bent in a cross-section (zx cross-section) in the first direction and to be bent in a cross-section (yz cross-section) in the second direction. The separation area VA may not be defined in the second adjacent corner area ACA2.

The middle area MA may be between the central area CA and the corner area CNA. The middle area MA may extend between the central area CA and the first adjacent corner area ACA1. In addition, the middle area MA may extend between the central area CA and the second adjacent corner area ACA2. The middle area MA may at least partially surround the central area CA, the first side surface area SA1, and the second side surface area SA2.

As shown in FIG. 5, the plurality of pixels PX may be arranged in the central area CA, the first side surface area SA1, the second side surface area SA2, the corner area CNA, and the middle area MA. Accordingly, the display panel 10 may display an image in the central area CA, the first side surface area SA1, the second side surface area SA2, the corner area CNA, and the middle area MA. The plurality of extension areas EA may each include a pixel area PXA, and the plurality of pixels PX may be arranged in the pixel area PXA. In each of the plurality of extension areas EA, the plurality of pixels PX may be arranged in an extension direction of the extension area EA. The pixel PX may include the display element DPE refer to FIG. 4.

The driving circuit DC which provides an electrical signal to the pixel PX and/or a power supply line which provides power may be arranged in the middle area MA. A plurality of driving circuits DC may be provided. The driving circuit DC may extend in a direction in which the middle area MA extends. The driving circuit DC may at least partially surround the central area CA, the first side surface area SA1, and the second side surface area SA2.

The pixel PX in the middle area MA may overlap the driving circuit DC and/or the power supply line. In this case, the middle area MA may also function as a display area even when the driving circuit DC and/or the power supply line are arranged therein. However, the disclosure is not limited thereto. In an embodiment, the driving circuit DC and/or the power supply line may not be arranged in the middle area MA, for example. In this case, the pixel PX in the middle area MA may not overlap the driving circuit DC and/or the power supply line.

Figure 6:
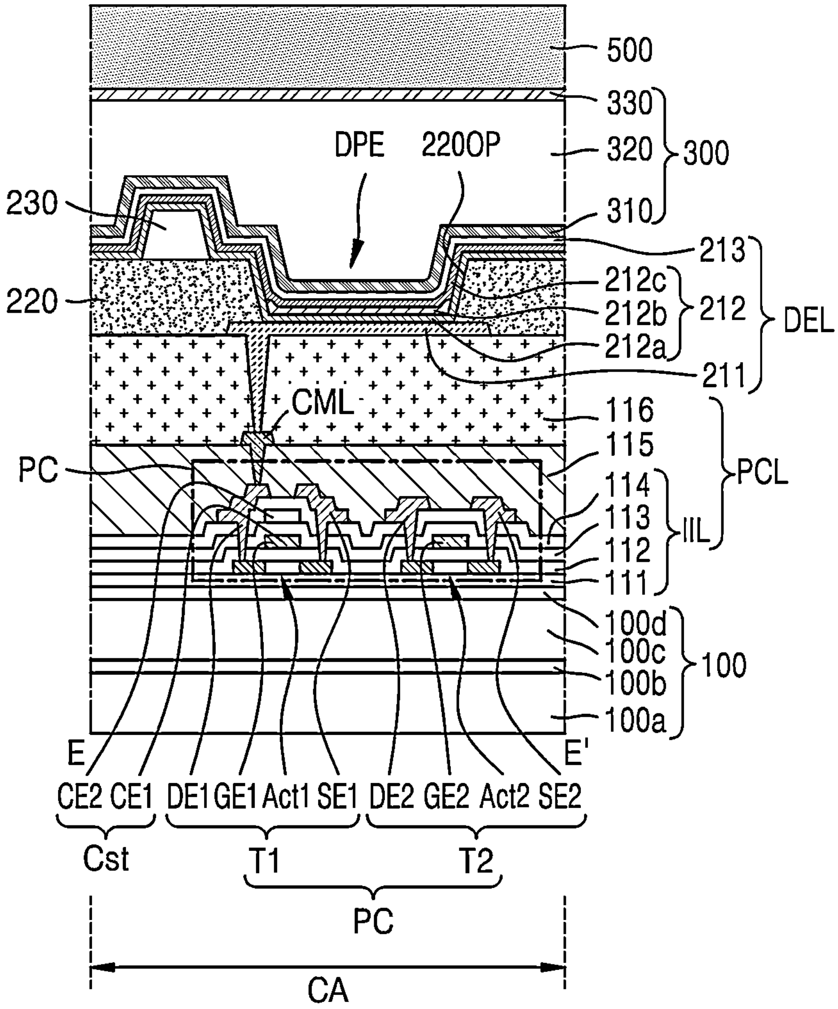
FIG. 6 is a schematic cross-sectional view of an embodiment of the display panel of FIG. 3, taken along line E-E' of FIG. 5.

FIG. 6 is a cross-sectional view taken along line E-E' of FIG. 5, schematically illustrating an embodiment of the display panel 10.

Referring to FIG. 6, the display panel 10 may include the substrate 100, a pixel circuit layer PCL, a display element layer DEL, and an encapsulation layer 300.

The substrate 100 may include various materials, such as glass, metal, or an organic material. In an optional embodiment, the substrate 100 may include a flexible material. In an embodiment, the substrate 100 may include ultra-thin flexible glass (e.g., a thickness thereof is several tens of micrometers (μm) to several hundreds of μm) or a polymer resin, for example. When the substrate 100 includes a polymer resin, the substrate 100 may include polyimide. In an alternative embodiment, the substrate 100 may include polyethersulfone, polyarylate, polyetherimide, polyethylene naphthalate, polyethylene terephthalate, polyphenylene sulfide, polycarbonate, cellulose triacetate ("TAC") and/or cellulose acetate propionate, or the like.

In an embodiment, the substrate 100 may include a first base layer 100*a*, a first barrier layer 100*b*, a second base layer 100*c*, and a second barrier layer 100*d*. In an embodiment, the first base layer 100*a*, the first barrier layer 100*b*, the second base layer 100*c*, and the second barrier layer 100*d* may be sequentially stacked. In an alternative embodiment, the substrate 100 may include glass.

At least one of the first base layer 100*a* and the second base layer 100*c* may include a polymer resin, such as polyethersulfone, polyarylate, polyetherimide, polyethylene naphthalate, polyethylene terephthalate, polyphenylene sulfide, polyimide, polycarbonate, TAC, cellulose acetate propionate, or the like.

The first barrier layer 100*b* and the second barrier layer 100*d* are barrier layers which prevent penetration of external foreign materials, and may include a single layer or a multi-layer, each including an inorganic material such as silicon nitride ($SiN_x$), silicon oxide ($SiO_2$), and/or silicon oxynitride (SiON).

The pixel circuit layer PCL may be disposed on the substrate 100. The pixel circuit layer PCL may include the pixel circuit PC. The pixel circuit PC may be arranged in the central area CA. In an embodiment, the pixel circuit PC may include at least one thin-film transistor. The pixel circuit PC may include the first thin-film transistor T1, the second thin-film transistor T2, and the storage capacitor Cst.

The pixel circuit layer PCL may further include an inorganic insulating layer IIL disposed below or/and above the components of the first thin-film transistor T1, a first insulating layer 115, and a second insulating layer 116. The inorganic insulating layer IIL may include a buffer layer 111, a first gate insulating layer 112, a second gate insulating layer 113, and an inter-insulating layer 114. The first thin-film transistor T1 may include a first semiconductor layer Act1, a first gate electrode GE1, a first source electrode SE1, and a first drain electrode DE1.

The buffer layer 111 may be disposed on the substrate 100. The buffer layer 111 may include an inorganic insulating material, such as silicon nitride ($SiN_X$), silicon oxynitride (SiON), and silicon oxide ($SiO_2$), and may include a single layer or a multi-layer, each including the inorganic insulating material stated above.

The first semiconductor layer Act1 may be disposed on the buffer layer 111. The first semiconductor layer Act1 may include polysilicon. In an alternative embodiment, the first semiconductor layer Act1 may include amorphous silicon, an oxide semiconductor, an organic semiconductor, or the like. The first semiconductor layer Act1 may include a channel area, a drain area, and a source area. The drain area and the source area may be respectively arranged on opposite sides of the channel area.

The first gate electrode GE1 may overlap the channel area. The first gate electrode GE1 may include a low-resistance metal material. The first gate electrode GE1 may include a conductive material including molybdenum (Mo), aluminum (Al), copper (Cu), titanium (Ti), or the like, and may be a multi-layer or a single layer, each including the material stated above.

The first gate insulating layer 112 between the first semiconductor layer Act1 and the first gate electrode GE1 may include an inorganic insulating material, such as silicon oxide ($SiO_2$), silicon nitride ($SiN_X$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_X$), or the like. In an embodiment, the zinc oxide ($ZnO_X$) may include zinc oxide (ZnO) and/or zinc peroxide ($ZnO_2$).

The second gate insulating layer 113 may cover the first gate electrode GE1. Similar to the first gate insulating layer 112, the second gate insulating layer 113 may include an inorganic insulating material, such as silicon oxide ($SiO_2$), silicon nitride ($SiN_X$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_X$), or the like.

An upper electrode CE2 of the storage capacitor Cst may be disposed on the second gate insulating layer 113. The upper electrode CE2 may overlap the first gate electrode GE1 therebelow. At this time, the first gate electrode GE1 of the first thin-film transistor T1 and the upper electrode CE2, the first gate electrode GE1 and the upper electrode CE2 overlapping each other with the second gate insulating layer 113 therebetween, may constitute the storage capacitor Cst. That is, the first gate electrode GE1 of the first thin-film transistor T1 may function as a lower electrode CE1 of the storage capacitor Cst. In other words, the storage capacitor Cst may overlap the first thin-film transistor T1. In some embodiments, the storage capacitor Cst may not overlap the first thin-film transistor T1. The upper electrode CE2 may include Al, platinum (Pt), palladium (Pd), silver (Ag), magnesium (Mg), gold (Au), nickel (Ni), neodymium (Nd), iridium (Ir), chromium (Cr), calcium (Ca), Mo, Ti, tungsten (W), and/or Cu, and may include a single layer or a multi-layer, each including the above-stated material.

The inter-insulating layer 114 may cover the upper electrode CE2. The inter-insulating layer 114 may include an inorganic insulating material, such as silicon oxide ($SiO_2$), silicon nitride ($SiN_X$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_X$), or the like. The inter-insulating layer 114 may include a single layer or a multi-layer, each including the inorganic insulating material stated above.

Each of the first drain electrode DE1 and the first source electrode SE1 may be disposed on the inter-insulating layer 114. The first drain electrode DE1 and the first source electrode SE1 may each include a material having good conductivity. The first drain electrode DE1 and the first source electrode SE1 may each include a conductive material including Mo, Al, Cu, Ti, or the like, and may include a multi-layer or a single layer, each including the above material. In an embodiment, the first drain electrode DE1 and the first source electrode SE1 may each have a multi-layered structure of Ti/Al/Ti.

The second thin-film transistor T2 may include a second semiconductor layer Act2, a second gate electrode GE2, a second drain electrode DE2, and a second source electrode SE2. Because the second semiconductor layer Act2, the second gate electrode GE2, the second drain electrode DE2, and the second source electrode SE2 are respectively similar to the first semiconductor layer Act1, the first gate electrode GE1, the first drain electrode DE1, and the first source electrode SE1, detailed descriptions thereof are omitted.

The first insulating layer 115 may be disposed on at least one thin-film transistor. In an embodiment, the first insulating layer 115 may cover the first drain electrode DE1 and the first source electrode SE1. The first insulating layer 115 may include an organic material. In an embodiment, the first insulating layer 115 may include a general commercial polymer, such as poly(methyl methacrylate) ("PMMA") or polystyrene ("PS"), a polymer derivative having a phenol group, and an organic insulating material, such as an acrylic polymer, an imide polymer, an aryl ether polymer, an amide polymer, a fluorine polymer, a p-xylene polymer, a vinyl alcohol polymer, and any combinations thereof, for example.

A connection electrode CML may be disposed on the first insulating layer 115. At this time, the connection electrode CML may be connected to the first drain electrode DE1 or the first source electrode SE1 through a contact hole in the first insulating layer 115. The connection electrode CML may include a material having good conductivity. The connection electrode CML may include a conductive material including Mo, Al, Cu, Ti, or the like, and may include a multi-layer or a single layer, each including the above material. In an embodiment, the connection electrode CML may include a multi-layered structure of Ti/Al/Ti.

The second insulating layer 116 may cover the connection electrode CML and the first insulating layer 115. The second insulating layer 116 may include an organic material. The second insulating layer 116 may include a general commercial polymer, such as PMMA or polystyrene PS, a polymer derivative having a phenol group, and an organic insulating material, such as an acrylic polymer, an imide polymer, an aryl ether polymer, an amide polymer, a fluorine polymer, a p-xylene polymer, a vinyl alcohol polymer, and any combinations thereof.

The display element layer DEL may be disposed on the pixel circuit layer PCL. The display element layer DEL may include the display element DPE, a pixel defining layer 220, and a spacer 230. The display element DPE may include an organic light-emitting diode. The display element DPE may be electrically connected to the connection electrode CML through a contact hole in the second insulating layer 116. The display element DPE may include a pixel electrode 211, an intermediate layer 212, and an opposite electrode 213. In an embodiment, the display element DPE in the central area CA may overlap the pixel circuit PC in the central area CA.

The pixel electrode 211 may be disposed on the second insulating layer 116. The pixel electrode 211 may be electrically connected to the connection electrode CML through a contact hole in the second insulating layer 116. The pixel electrode 211 may include a conductive oxide, such as indium tin oxide ("ITO"), indium zinc oxide ("IZO"), zinc oxide (ZnO), indium oxide ($In_2O_3$), indium gallium oxide ("IGO"), or aluminum zinc oxide ("AZO"). In another embodiment, the pixel electrode 211 may include a reflective film including Ag, Mg, Al, Pt, Pd, Au, Ni, Nd, Ir, Cr, or any combinations thereof. In another embodiment, the pixel electrode 211 may further include a film including ITO, IZO, ZnO, or $In_2O_3$ above/below the reflective film stated above.

The pixel defining layer 220 in which an opening 220OP exposing a central portion of the pixel electrode 211 is defined may be disposed on the pixel electrode 211. The opening 220OP of the pixel defining layer 220 may define an emission area of light emitted by the display element DPE. In an embodiment, the width of the opening 220OP of the pixel defining layer 220 may correspond to the width of the emission area, for example. In addition, the width of the opening 220OP of the pixel defining layer 220 may correspond to the width of a sub-pixel.

In an embodiment, the pixel defining layer 220 may include an organic insulating material. In another embodiment, the pixel defining layer 220 may include an inorganic insulating material, such as silicon nitride ($SiN_X$), silicon oxynitride (SiON), or silicon oxide ($SiO_2$). In another embodiment, the pixel defining layer 220 may include an organic insulating material and an inorganic insulating material. In some embodiments, the pixel defining layer 220 may include a light-blocking material, and may be provided in black. The light-blocking material may include carbon black, carbon nanotubes, a resin or paste including a black dye, metal particles, such as nickel, aluminum, molybdenum, and alloys thereof, metal oxide particles (e.g., chromium oxide), metal nitride particles (e.g., chromium nitride), or the like. When the pixel defining layer 220 includes a light-blocking material, reflection of external light by metal structures disposed on a lower portion of the pixel defining layer 220 may be reduced.

The spacer 230 may be disposed on the pixel defining layer 220. The spacer 230 may prevent damage to the substrate 100 and/or a multi-layered film on the substrate 100 in a method of manufacturing a display apparatus. In a method of manufacturing a display panel, a mask sheet may be used. At this time, the mask sheet may enter the opening 220OP of the pixel defining layer 220 or may be in close contact with the pixel defining layer 220. The spacer 230 may prevent or reduce a defect in which the substrate 100 and a portion of the multi-layered film are damaged by the mask sheet when a deposition material is deposited on the substrate 100.

The spacer 230 may include an organic material, such as polyimide. In an alternative embodiment, the spacer 230 may include an inorganic insulating material, such as silicon nitride ($SiN_X$) or silicon oxide ($SiO_2$), or may include an organic insulating material and an inorganic insulating material. In an embodiment, the spacer 230 may include a material different from that of the pixel defining layer 220. In another embodiment, the spacer 230 may include the same material as that of the pixel defining layer 220. In this case, the pixel defining layer 220 and the spacer 230 may be formed together in a mask operation using a halftone mask or the like.

The intermediate layer 212 may be disposed on the pixel defining layer 220. The intermediate layer 212 may include an emission layer 212*b* arranged to correspond to the opening 220OP of the pixel defining layer 220. The emission layer 212*b* may include a polymer organic material or a low-molecular-weight organic material, which emits light of a predetermined color.

The intermediate layer 212 may include at least one of a first functional layer 212*a* between the pixel electrode 211 and the emission layer 212*b* and a second functional layer 212*c* between the emission layer 212*b* and the opposite electrode 213. In an embodiment, the first functional layer 212*a* and the second functional layer 212*c* may be respectively disposed below and on the emission layer 212*b*. The first functional layer 212*a* may include a hole transport layer ("HTL"), or an HTL and a hole injection layer ("HIL"). The second functional layer 212*c* may include an electron transport layer ("ETL") and/or an electron injection layer ("EIL"). Similar to the opposite electrode 213 to be described below, the first functional layer 212*a* and/or the second functional layer 212*c* may be a common layer entirely covering the substrate 100.

The opposite electrode 213 may be disposed on the intermediate layer 212. The opposite electrode 213 may include a conductive material having a substantially low work function. In an embodiment, the opposite electrode 213 may include a (semi)transparent layer, the (semi)transparent layer including Ag, Mg, Al, Pt, Pd, Au, Ni, Nd, Ir, Cr, lithium (Li), Ca, alloys thereof, or the like, for example. In an alternative embodiment, the opposite electrode 213 may further include a layer, such as ITO, IZO, ZnO, or $In_2O_3$, above the (semi)transparent layer including the material stated above.

In some embodiments, a capping layer for improving an extraction rate of light emitted by the display element DPE may be further disposed on the opposite electrode 213. The capping layer may include an inorganic insulating material, such as silicon nitride, and/or may include an organic insulating material. When the capping layer includes an organic insulating material, the capping layer may include, e.g., an organic insulating material, such as a triamine derivative, a carbazole biphenyl derivative, an arylenediamine derivative, an aluminum quinolium complex ($Alq_3$), acrylic, polyimide, polyamide, or the like.

The encapsulation layer 300 may be disposed on the opposite electrode 213. In addition, when a capping layer is arranged, the encapsulation layer 300 may be disposed on the capping layer. In an embodiment, the encapsulation layer 300 may include at least one inorganic encapsulation layer and at least one organic encapsulation layer. In an embodiment, the encapsulation layer 300 may include a first inorganic encapsulation layer 310, an organic encapsulation layer 320, and a second inorganic encapsulation layer 330, which are sequentially stacked.

The first inorganic encapsulation layer 310 and the second inorganic encapsulation layer 330 may each include at least one inorganic material from among aluminum oxide ($Al_2O_3$), titanium oxide ($TiO_2$), tantalum oxide ($Ta_2O_5$), hafnium oxide ($HfO_2$), zinc oxide ($ZnO_X$), silicon oxide ($SiO_2$), silicon nitride ($SiN_X$), and silicon oxynitride (SiON). The organic encapsulation layer 320 may include a polymer-based material. The polymer-based material may include an acrylic resin, an epoxy resin, polyimide, polyethylene, or the like. In an embodiment, the organic encapsulation layer 320 may include acrylate.

A resin layer 500 may be disposed on the display panel 10, in particular, the encapsulation layer 300. The resin layer 500 may cover the encapsulation layer 300. The resin layer 500 may have a substantially high modulus, and may be between the display panel 10 and the cover window CW. The resin layer 500 may cover the entirety of the surface of the display panel 10 to enhance rigidity of the display panel 10.

Although not illustrated in FIG. 6, a touch sensor layer may be between the encapsulation layer 300 and the resin layer 500. The touch sensor layer may obtain coordinate information according to an external input, e.g., a touch event. The touch sensor layer may include a sensing electrode (or a touch electrode) and a trace line connected to the sensing electrode. The touch sensor layer may sense an external input in a mutual-cap method and/or a self-cap method.

Although not illustrated in FIG. 6, an anti-reflection layer may be disposed on the touch sensor layer. The anti-reflection layer may reduce reflectance of light incident toward the display panel 10. In an embodiment, the anti-reflection layer may include a retarder and/or a polarizer. The retarder may be a film type or a liquid-crystal coating type, and may include a λ/2 retarder and/or a λ/4 retarder. The polarizer may also be a film type or a liquid-crystal coating type. The film-type polarizer may include a stretch-type synthetic resin film, and the liquid-crystal-coating-type polarizer may include liquid crystals in a predetermined arrangement. The retarder and the polarizer may further include a protective film.

In an alternative embodiment, the anti-reflection layer may include a black matrix and color filters. The color filters may be arranged considering a color of light emitted from each of a plurality of display elements DPE of the display panel 10. Each of the color filters may include red, green, or blue pigments or dyes. In an alternative embodiment, each of the color filters may further include quantum dots in addition to the pigments or dyes stated above. In an alternative embodiment, some of the color filters may not include the pigments or dyes stated above, and may include scattering particles such as titanium oxide.

In an alternative embodiment, the anti-reflection layer may include a destructive interference structure. The destructive interference structure may include a first reflective layer and a second reflective layer, which are on different layers. First reflected light and second reflected light respectively reflected by the first reflective layer and the second reflective layer may destructively interfere with each other, and accordingly, the reflectance of external light may be reduced.

In an embodiment, the resin layer 500 may be disposed on the display panel 10 as described above. This will be described below with reference to FIG. 7.

Figure 7:
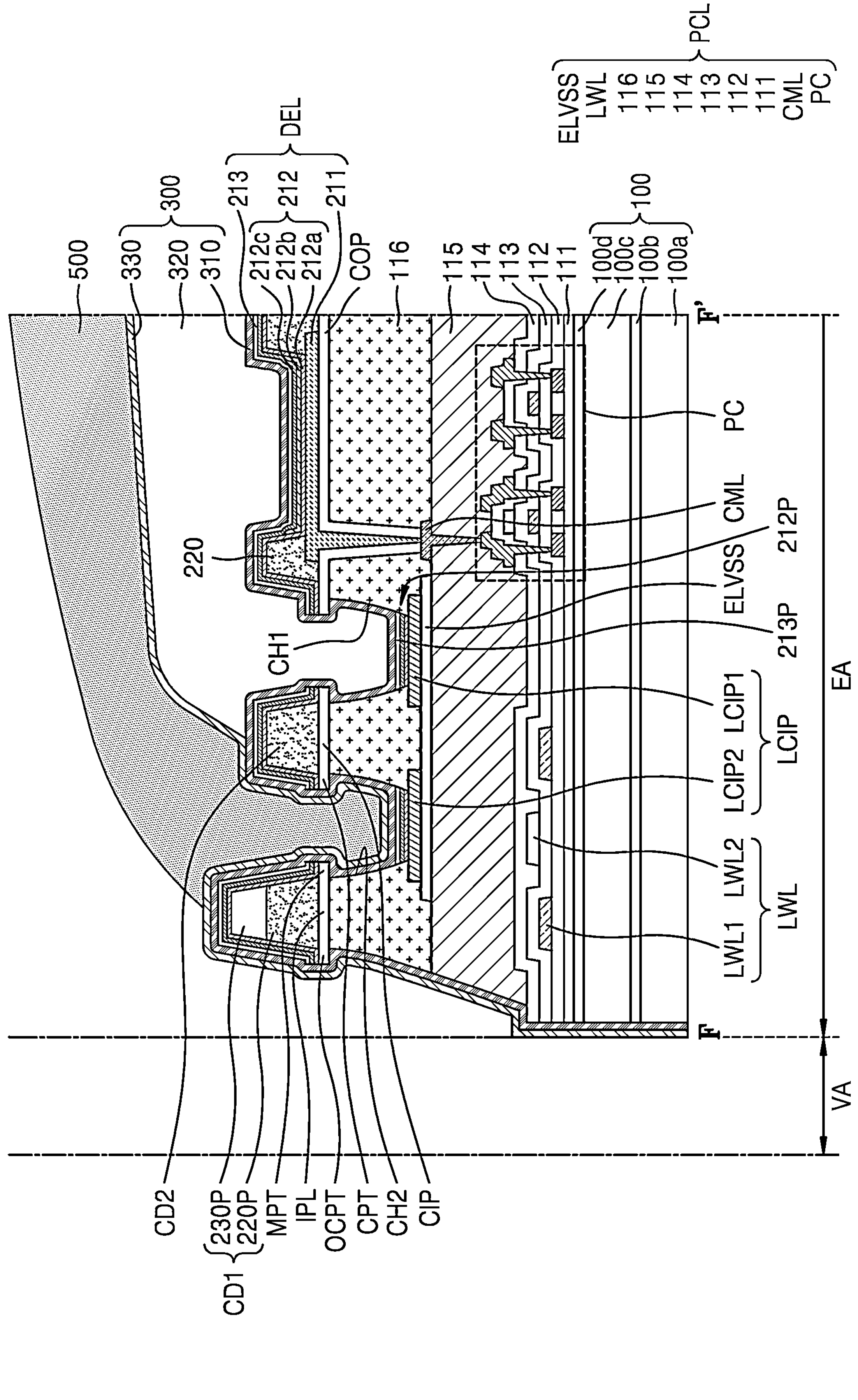
FIG. 7 is a schematic cross-sectional view of an embodiment of the display panel of FIG. 3, taken along line F-F' of FIG. 5.

FIG. 7 is a cross-sectional view taken along line F-F' of FIG. 5, schematically illustrating an embodiment of the display panel 10.

The pixel PX in the central area CA of FIG. 5 has been described with reference to FIG. 6, and hereinafter, a structure of a portion near the separation area VA in the extension area EA and the pixel PX in the extension area EA are described with reference to FIG. 7. The same reference numbers of FIG. 7 as those shown in FIG. 6 mean the same or corresponding members, and thus descriptions thereof are be omitted for convenience of description.

Referring to FIG. 7, the pixel circuit layer PCL may include the pixel circuit PC, the buffer layer 111, the first gate insulating layer 112, the second gate insulating layer 113, the inter-insulating layer 114, the first insulating layer 115, the second insulating layer 116, and the connection electrode CML. The pixel circuit layer PCL may include a lower line LWL and an electrode power supply line ELVS.

The lower line LWL may transmit a power voltage and/or an electrical signal to a pixel in the corner area CNA. The lower line LWL may include a first lower line LWL1 and a second lower line LWL2. The first lower line LWL1 may be between the first gate insulating layer 112 and the second gate insulating layer 113, and the second lower line LWL2 may be between the second gate insulating layer 113 and the inter-insulating layer 114.

Similarly to the connection electrode CML, the electrode power supply line ELVS may be disposed on the first insulating layer 115, and may be simultaneously formed of the same material as that of the connection electrode CML. The electrode power supply line ELVS may be electrically connected to the opposite electrode 213 of an organic light-emitting diode, which is the display element DPE (refer to FIG. 6), to apply an electrical signal to the opposite electrode 213.

The second insulating layer 116 may cover the electrode power supply line ELVS and the connection electrode CML. As shown in FIG. 7, a first corner hole CH1 and a second corner hole CH2 may be defined in the second insulating layer 116. As a contact hole is defined in the second insulating layer 116, the pixel electrode 211 on the second insulating layer 116 may be connected to the connection electrode CML through the contact hole. The first corner hole CH1, the second corner hole CH2, and the contact hole may be simultaneously defined.

The first corner hole CH1 and the second corner hole CH2 may overlap the electrode power supply line ELVS, and a lower corner inorganic pattern LCIP on the electrode power supply line ELVS may prevent or minimize damage to the electrode power supply line ELVS in a process of defining the first corner hole CH1 and the second corner hole CH2. In particular, the lower corner inorganic pattern LCIP includes a first lower corner inorganic pattern LCIP1 and a second lower corner inorganic pattern LCIP2, the first lower corner inorganic pattern LCIP1 may overlap the first corner hole CH1, and the second lower corner inorganic pattern LCIP2 may overlap the second corner hole CH2. Accordingly, the lower corner inorganic pattern LCIP may prevent the electrode power supply line ELVS from being damaged or minimize damage to the electrode power supply line ELVS by preventing the electrode power supply line ELVS from being exposed or minimizing an exposure degree of the electrode power supply line ELVS in a process of defining the first corner hole CH1 and the second corner hole CH2. The lower corner inorganic pattern LCIP may include silicon oxide ($SiO_X$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), hafnium oxide ($HfO_2$), zinc oxide ($ZnO$ or $ZnO_2$), or the like.

An overlapping inorganic pattern COP, a corner inorganic pattern CIP, and an inorganic pattern line IPL may be on the second insulating layer 116. The overlapping inorganic pattern COP, the corner inorganic pattern CIP, and the inorganic pattern line IPL may be simultaneously formed, and may include or consist of the same material as each other. The overlapping inorganic pattern COP, the corner inorganic pattern CIP, and the inorganic pattern line IPL may each include silicon oxide ($SiO_X$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), hafnium oxide ($HfO_2$), zinc oxide ($ZnO$ or $ZnO_2$), or the like.

The overlapping inorganic pattern COP is on the second insulating layer 116, and may be near the contact hole of the second insulating layer 116. As shown in FIG. 7, the overlapping inorganic pattern COP may be on the inner surface of the contact hole of the second insulating layer 116. In this case, the pixel electrode 211 on the second insulating layer 116 may be connected to the connection electrode CML through the contact hole of the second insulating layer 116 while being on the overlapping inorganic pattern COP.

The corner inorganic pattern CIP is spaced apart from the overlapping inorganic pattern COP by the first corner hole CH1, and may have a shape that at least partially surrounds the overlapping inorganic pattern COP in a plan view. The inorganic pattern line IPL is spaced apart from the corner inorganic pattern CIP by the second corner hole CH2, and may have a shape that at least partially surrounds the corner inorganic pattern CIP in a plan view.

The corner inorganic pattern CIP may include a corner protruding tip CPT protruding toward the center of at least one of the first corner hole CH1 and the second corner hole CH2. FIG. 7 illustrates that the corner inorganic pattern CIP protrudes toward the center of each of the first corner hole CH1 and the second corner hole CH2. The inorganic pattern line IPL may include a middle protruding tip MPT protruding toward the center of the second corner hole CH2. In addition, the inorganic pattern line IPL may include an outer corner protruding tip OCPT protruding in a direction of the separation area VA. As shown in FIG. 7, the overlapping inorganic pattern COP may also include a protruding tip protruding toward the center of the first corner hole CH1.

The pixel defining layer 220 may cover an edge of the pixel electrode 211. At this time, when the pixel defining layer 220 is formed, a first pattern 220P may be simultaneously formed, and may include or consist of the same material as that of the pixel defining layer 220. The first pattern 220P may be on the inorganic pattern line IPL. The first pattern 220P may constitute a first corner dam CD1 together with the inorganic pattern line IPL. When the spacer 230 is formed on the pixel defining layer 220, a second pattern 230P on the first pattern 220P may be simultaneously formed, and may include or consist of the same material as that of the spacer 230 (refer to FIG. 6). In this case, the first pattern 220P and the second pattern 230P may constitute the first corner dam CD1 together with the inorganic pattern line IPL. In addition, when the pixel defining layer 220 is formed, a second corner dam CD2 spaced apart from the first corner dam CD1 and disposed on the corner inorganic pattern CIP may be simultaneously formed, and may include or consist of the same material as that of the pixel defining layer 220.

Similarly to the central area CA described above with reference to FIG. 6, the intermediate layer 212 may also be disposed on the pixel defining layer 220 in the extension area EA. The intermediate layer 212 may include the emission layer 212*b* arranged in an opening of the pixel defining layer 220 and overlapping the pixel electrode 211. The intermediate layer 212 may further include at least one of the first functional layer 212*a* between the pixel electrode 211 and the emission layer 212*b* and the second functional layer 212*c* on the emission layer 212*b*.

As described above, the overlapping inorganic pattern COP may include a protruding tip protruding toward the center of the first corner hole CH1. Also, the corner inorganic pattern CIP may include the corner protruding tip CPT protruding toward the center of the first corner hole CH1. Accordingly, when the first functional layer 212*a* and the second functional layer 212*c* are formed, the first functional layer 212*a* and the second functional layer 212*c* may be spaced apart from each other by the protruding tip of the overlapping inorganic pattern COP and the corner protruding tip CPT of the corner inorganic pattern CIP, and a functional layer pattern 212P may be formed in the first corner hole CH1. In addition, as described above, the inorganic pattern line IPL includes the middle protruding tip MPT protruding toward the center of the second corner hole CH2. Accordingly, when the first functional layer 212*a* and the second functional layer 212*c* are formed, the functional layer pattern 212P in the second corner hole CH2 may be formed by the corner protruding tip CPT and the middle protruding tip MPT.

The opposite electrode 213 is formed on the pixel defining layer 220 and the intermediate layer 212 to correspond to a plurality of pixel electrodes 211. Accordingly, for the same reason as that for which the functional layer pattern 212P in the first corner hole CH1 and the second corner hole CH2 is formed, a common electrode pattern 213P in the first corner hole CH1 and the second corner hole CH2 may be formed.

The first inorganic encapsulation layer 310 of the encapsulation layer 300 may be on the opposite electrode 213, and may be in direct contact with the protruding tip of the overlapping inorganic pattern COP, the corner protruding tip CPT of the corner inorganic pattern CIP, and the middle protruding tip MPT of the inorganic pattern line IPL. Furthermore, in some cases, as shown in FIG. 7, the first inorganic encapsulation layer 310 may be in direct contact with the common electrode pattern 213P in the first corner hole CH1 and the second corner hole CH2, and may also cover inner side surfaces of the first corner hole CH1 and the second corner hole CH2. The organic encapsulation layer 320 of the encapsulation layer 300 is on the first inorganic encapsulation layer 310, and may fill the first corner hole CH1 as shown in FIG. 7. The second corner dam CD2 may prevent a material for forming the organic encapsulation layer 320 from flowing to the outside during a manufacturing process of the display panel 10. The second inorganic encapsulation layer 330 of the encapsulation layer 300 may be on the organic encapsulation layer 320. The second inorganic encapsulation layer 330 may be in direct contact with the first inorganic encapsulation layer 310 on the second corner dam CD2. When desired, the second inorganic encapsulation layer 330 may also be in direct contact with the first inorganic encapsulation layer 310 in the second corner hole CH2.

The resin layer 500 may be disposed on the encapsulation layer 300. In particular, the resin layer 500 may cover the encapsulation layer 300 in the extension area EA. In an embodiment, the resin layer 500 may be arranged between first corner dams CD1 respectively at opposite end portions of the extension area EA in a width direction of the extension area EA. Accordingly, a material for forming the resin layer 500 flowing to the outside may be prevented by the first corner dam CD1.

Figure 8:
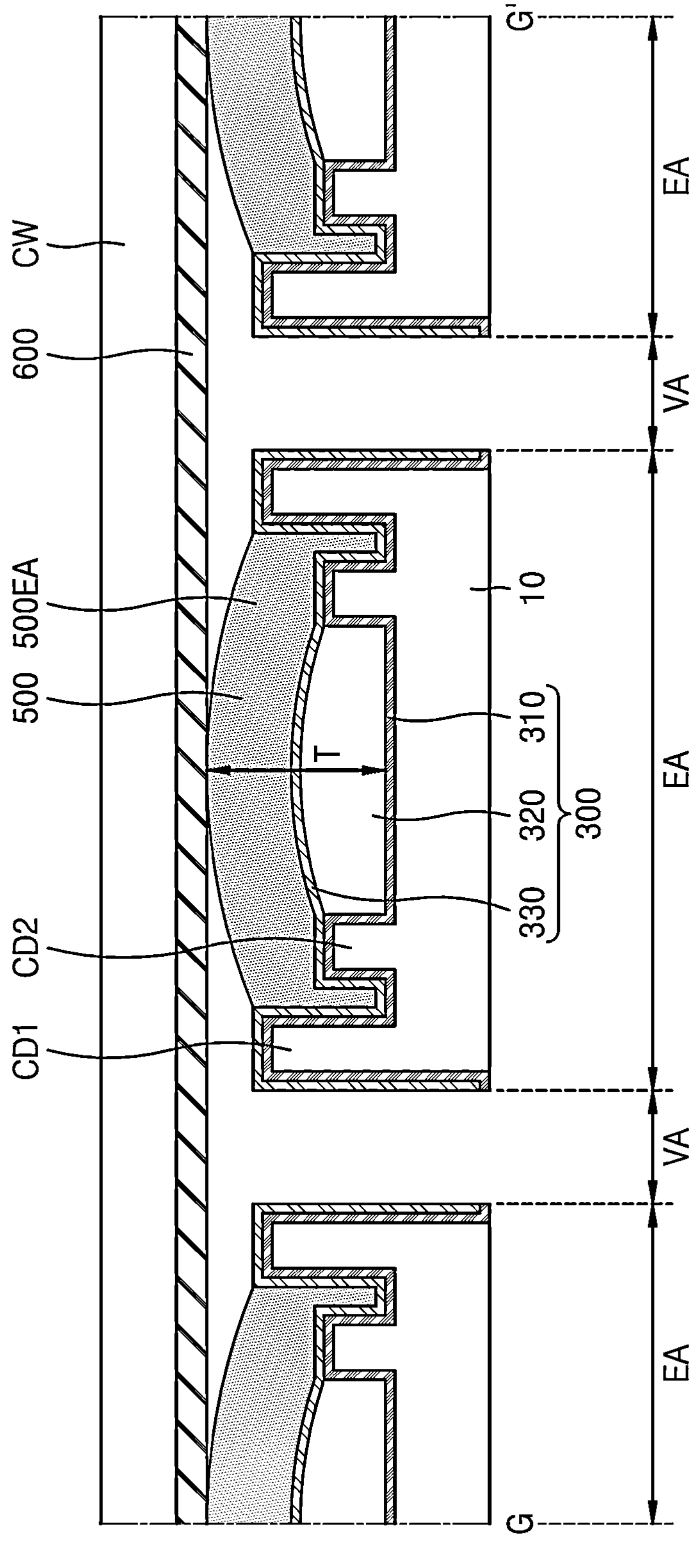
FIG. 8 is a schematic cross-sectional view taken along line G-G' of FIG. 5, schematically illustrating an embodiment of the display panel and layers disposed on the display panel.

FIG. 8 is a cross-sectional view taken along line G-G' of FIG. 5, schematically illustrating an embodiment of the display panel 10 and layers disposed on the display panel 10.

Referring to FIG. 8, as described above, the display panel 10 may include the extension area EA and the separation area VA. The display panel 10 may include the first corner dam CD1 at each of opposite end portions of the extension area EA in a width direction of the extension area EA. In an embodiment, the first corner dam CD1 may extend along the periphery of the extension area EA. In addition, the display panel 10 may include the second corner dam CD2 at each of opposite end portions of the extension area EA in the width direction of the extension area EA. In an embodiment, the second corner dam CD2 may extend along the periphery of the extension area EA. In addition, in an embodiment, the second corner dam CD2 may be arranged inside the first corner dam CD1 in the width direction of the extension area EA. In other words, the second corner dam CD2 may be surrounded by the first corner dam CD1.

The encapsulation layer 300, in particular, the organic encapsulation layer 320, may be between two second corner dams CD2. The first inorganic encapsulation layer 310 may be disposed below the organic encapsulation layer 320, and may cover a side surface of the display panel 10 by passing by the second corner dam CD2 and the first corner dam CD1. In addition, the second inorganic encapsulation layer 330 may be disposed on the organic encapsulation layer 320, and may cover the side surface of the display panel 10 by passing by the second corner dam CD2 and the first corner dam CD1. This has been described above with reference to FIG. 7, and thus, detailed descriptions thereof are omitted below.

The resin layer 500 may be disposed on the encapsulation layer 300 between the first corner dams CD1 respectively at opposite end portions of the extension area EA in the width direction of the extension area EA. In an embodiment, the resin layer 500 may be disposed on the second inorganic encapsulation layer 330, for example. The resin layer 500 may be disposed on the encapsulation layer 300 to enhance rigidity of the display panel 10. To this end, in an embodiment, the resin layer 500 may have a substantially high modulus. In an embodiment, the modulus of the resin layer 500 may be about 0.5 gigapascal (GPa) or more and about 3 GPa or less, and more preferably, about 0.8 GPa or more and about 1.5 GPa or less, for example.

In an embodiment, the resin layer 500 may include at least one of polyethylene terephthalate ("PET"), polyimide, polyethylene naphthalate, polyarylate, polycarbonate, polyetherimide ("PEI"), and polyethersulfone. In addition, the resin layer 500 may include a transparent material to be transparent. Accordingly, light emitted from the display element DPE (refer to FIG. 6) may easily pass through the resin layer 500.

In an embodiment, a thickness T of the resin layer 500 may be about 70 μm or more and about 110 μm or less, and more preferably about 100 μm. In the disclosure, the thickness T of the resin layer 500 may mean a length from the lowest height of the resin layer 500 to the highest height of the resin layer 500 on the display panel 10. In addition, the resin layer 500 may have a convex thickness between the first corner dams CD1 respectively at opposite end portions of the extension areas EA. This may be implemented by forming the resin layer 500 by coating droplets of a material for forming the resin layer 500 in a manufacturing process of the resin layer 500, as will be described below.

When a stacked structure including the display panel 10 is bent, a compressive stress or tensile stress may be applied to portions of the stacked structure according to positions thereof. In the stacked structure, a neutral plane, which is a position where a compressive stress and a tensile stress are zero, may exist. That is, when the stacked structure including the display panel 10 is bent, a compressive stress may be applied to the inside of the neutral plane, and a tensile stress may be applied to the outside of the neutral plane. A greater compressive stress or tensile stresses may be applied to portions of the stacked structure, which are farther away from the neutral plane. The resin layer 500 may move the neutral plane within a stacked structure including the display panel 10. That is, a stress applied to the display panel 10 may be adjusted by appropriately adjusting the thickness and/or modulus of the resin layer 500. In particular, by arranging the resin layer 500, the neutral plane may be moved upward to be adjacent to the encapsulation layer 300, in particular, the second inorganic encapsulation layer 330. Accordingly, a stress applied to the display panel 10, in particular, the second inorganic encapsulation layer 330, may be absent, or may be minimized even when being present. In addition, in the extension area EA which is bent, cracks that may be generated in the display panel 10, in particular, the second inorganic encapsulation layer 330, may be prevented.

In an embodiment, the resin layer 500 may include a resin layer central area (not shown) and a resin layer extension area 500EA. In particular, the resin layer central area is an area corresponding to the central area CA (refer to FIG. 5), and may be an area overlapping the central area CA in a plan view. The resin layer extension area 500EA is an area corresponding to the extension area EA (refer to FIG. 5), and may be an area overlapping the extension area EA in a plan view. The resin layer extension area 500EA may extend in a direction away from the resin layer central area. That is, the resin layer extension area 500EA may extend in a longitudinal direction of the extension area EA.

In addition, similarly, the resin layer 500 may include a resin layer middle area corresponding to the middle area MA (refer to FIG. 5), and a resin layer side surface area corresponding to the first side surface area SA1 (refer to FIG. 5) or the second side surface area SA2 (refer to FIG. 5). Hereinafter, the resin layer extension area 500EA is mainly described.

In an embodiment, a plurality of resin layer extension areas 500EA may be provided. The plurality of resin layer extension areas 500EA may respectively overlap a plurality of extension areas EA in a plan view.

In an embodiment, the resin layer extension area 500EA may overlap the encapsulation layer 300, in particular, the organic encapsulation layer 320, between two second corner dams CD2 in the width direction of the extension area EA. In addition, the resin layer extension area 500EA may not overlap the organic encapsulation layer 320 between the second corner dam CD2 and the first corner dam CD1. At this time, the resin layer extension area 500EA may overlap the first inorganic encapsulation layer 310 and the second inorganic encapsulation layer 330 between the first corner dam CD1 and the second corner dam CD2.

The cover window CW may be disposed above the resin layer 500. In addition, an adhesive layer 600 may be between the resin layer 500 and the cover window CW. In an embodiment, the adhesive layer 600 may be a transparent adhesive member, such as an OCA.

In an embodiment, the cover window CW and the adhesive layer 600 may cover the extension area EA and the separation area VA. In other words, the cover window CW and the adhesive layer 600 may overlap the resin layer 500 in the extension area EA. In addition, the cover window CW and the adhesive layer 600 may not overlap the resin layer 500 in the separation area VA. The cover window CW and the adhesive layer 600 may be spaced apart from the display panel 10 by the resin layer 500 by a predetermined interval in an amount of the thickness T of the resin layer 500. The resin layer 500 may move a neutral plane of a display apparatus upward as described above.

Figure 9A:
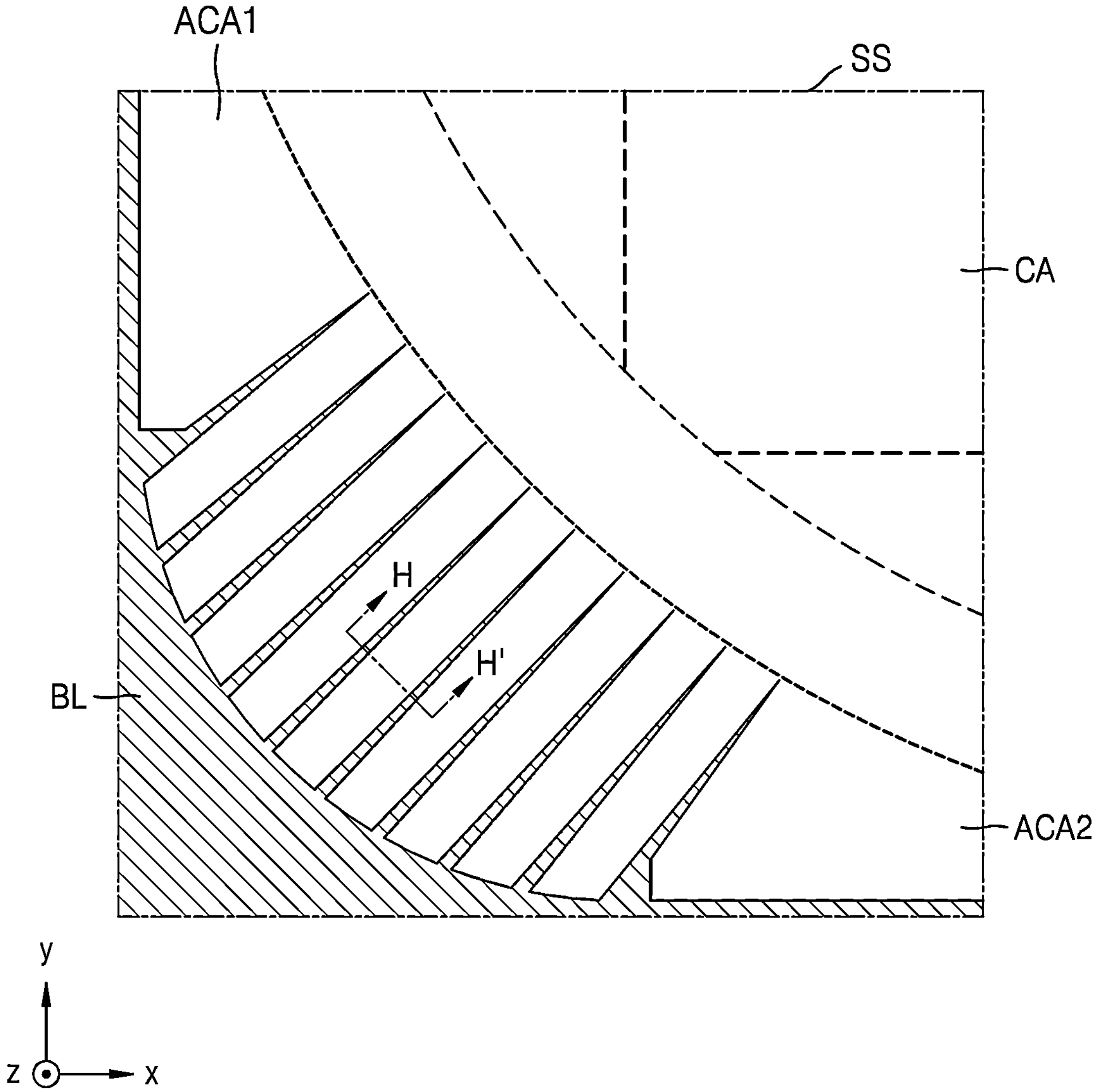
FIG. 9A is a plan view schematically illustrating an embodiment of a method of manufacturing a display apparatus.
Figure 9B:
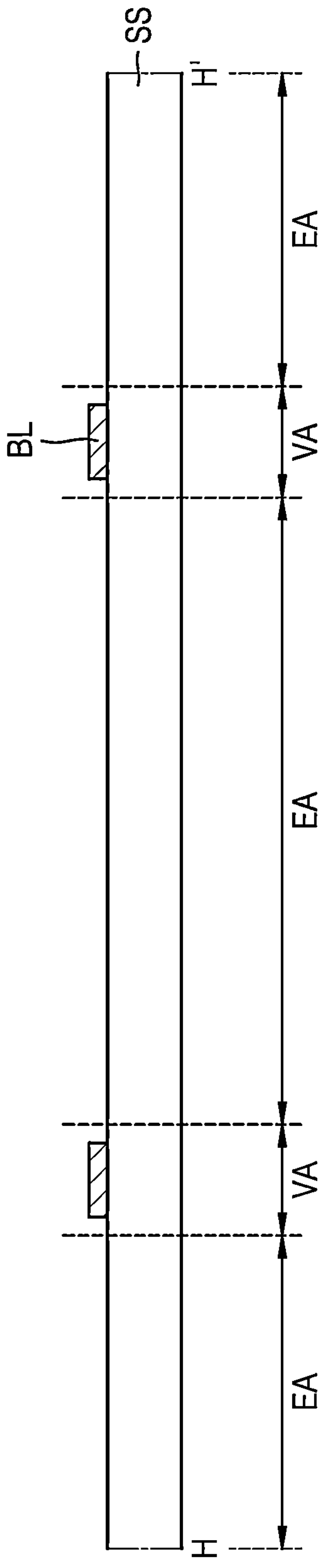
FIG. 9B is a cross-sectional view taken along line H-H' of FIG. 9A.

FIG. 9A is a plan view schematically illustrating an embodiment of a method of manufacturing a display apparatus. FIG. 9B is a cross-sectional view taken along line H-H' of FIG. 9A. The method of manufacturing a display apparatus, in an embodiment, may be used to manufacture the above-described display apparatus, but is not limited thereto.

Referring to FIGS. 9A and 9B, a support substrate SS may be formed on a blocking layer BL. The support substrate SS is a material having hardness and rigidity that may support a display panel and/or a display apparatus which is being manufactured, and may include, e.g., glass. The blocking layer BL may correspond to the corner CN in a display panel and/or a display apparatus which is being manufactured.

The blocking layer BL may include a material capable of blocking a laser used in an operation of separating the display panel and/or the display apparatus which is being manufactured from the support substrate SS. In an embodiment, the blocking layer BL may include a material having an absorptivity of about 90% or more (or a transmittance of about 10% or less) in the vicinity of a wavelength of about 300 nanometers (nm). In an embodiment, the blocking layer BL may include at least one of amorphous silicon (a-Si), polysilicon (Poly-Si), crystalline silicon (Crystalline-Si), ZnO, IZO, or the like. In an embodiment, when using an excimer laser having a wavelength of 308 nm, the blocking layer BL may preferably use amorphous silicon (a-Si), for example.

The blocking layer BL may be formed by being patterned through an exposure and development process using a photoresist. In an embodiment, the blocking layer BL may include a plurality of extension portions. In an embodiment, the blocking layer BL may overlap the separation area VA. That is, the blocking layer BL may be arranged outside the extension area EA, the first adjacent corner area ACA1, and the second adjacent corner area ACA2.

Figure 10:
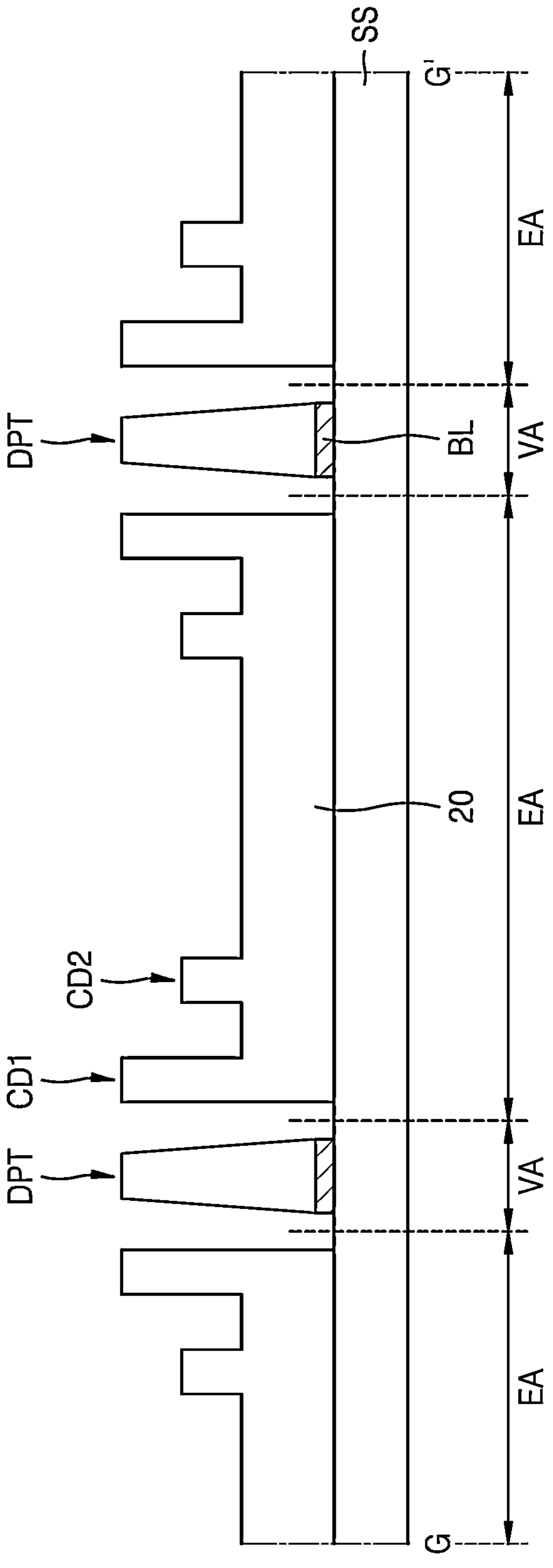
FIG. 10 is a cross-sectional view schematically illustrating an embodiment of a method of manufacturing a display apparatus.

FIG. 10 is a cross-sectional view schematically illustrating an embodiment of a method of manufacturing a display apparatus. FIG. 10 illustrates layers disposed below the encapsulation layer 300 (refer to FIG. 6) in the display panel 10 as a stacked body 20 as the display panel 10 which is being manufactured.

Referring to FIG. 10, a plurality of layers may be stacked on the support substrate SS to form the display panel 10 excluding the encapsulation layer 300 (refer to FIG. 7), that is, the stacked body 20. In particular, the substrate 100 (refer to FIG. 7), the pixel circuit layer PCL (refer to FIG. 7), and the display element layer DEL (refer to FIG. 7) may be stacked on the support substrate SS. At this time, at least a portion of the stacked body 20 between a plurality of extension areas EA, that is, the portion overlapping the separation area VA, may be removed. In particular, the stacked body 20 may be removed from a boundary between the separation area VA and the plurality of extension areas EA, but may not be removed from the center of the separation area VA. Accordingly, in the stacked body 20, a dummy pattern DPT overlapping the separation area VA may be formed.

In addition, as described above, in the stacked body 20, one first corner dam CD1 may be formed at each of opposite end portions of the extension area EA in a width direction of the extension area EA. In addition, in the stacked body 20, one second corner dam CD2 may be formed at each of the opposite end portions of the extension area EA in the width direction of the extension area EA. In an embodiment, the second corner dam CD2 may be arranged inside of the first corner dam CD1 in the width direction of the extension area EA.

Figure 11:
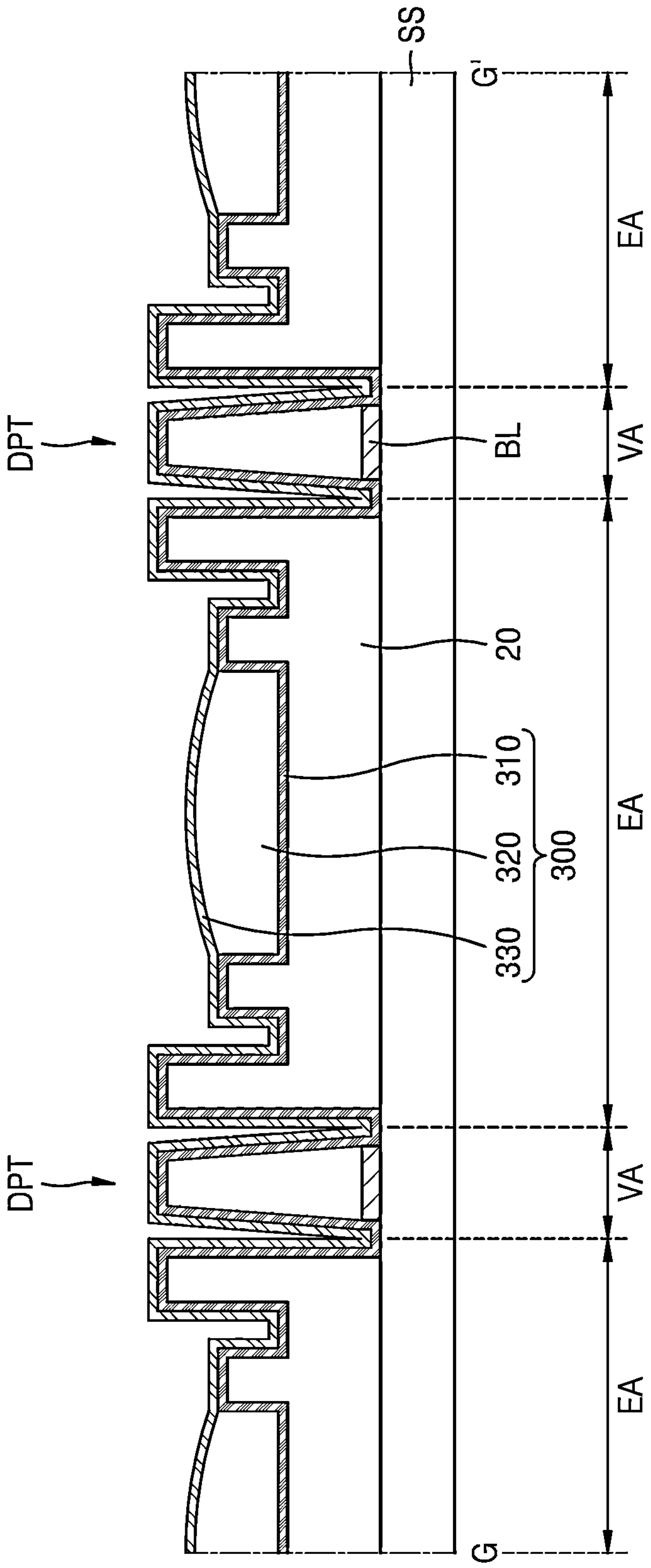
FIG. 11 is a cross-sectional view schematically illustrating an embodiment of a method of manufacturing a display apparatus.

FIG. 11 is a cross-sectional view schematically illustrating an embodiment of a method of manufacturing a display apparatus.

Referring to FIG. 11, the encapsulation layer 300 may be formed on the stacked body 20. First, the first inorganic encapsulation layer 310 may be arranged to cover the stacked body 20. The first inorganic encapsulation layer 310 may be continuously formed to cover the side surface of the stacked body 20 at the boundary between the extension area EA and the separation area VA.

The organic encapsulation layer 320 may be disposed on the first inorganic encapsulation layer 310. The organic encapsulation layer 320 may be discharged, e.g., by a jetting method. At this time, the organic encapsulation layer 320 may be coated between second corner dams CD2. Accordingly, the organic encapsulation layer 320 may not be arranged between the second corner dam CD2 and the first corner dam CD1.

The second inorganic encapsulation layer 330 may be disposed on the organic encapsulation layer 320 again. Similarly to the first inorganic encapsulation layer 310, the second inorganic encapsulation layer 330 may be continuously formed to cover the side surface of the stacked body 20 at the boundary between the extension area EA and the separation area VA.

Figure 12A:
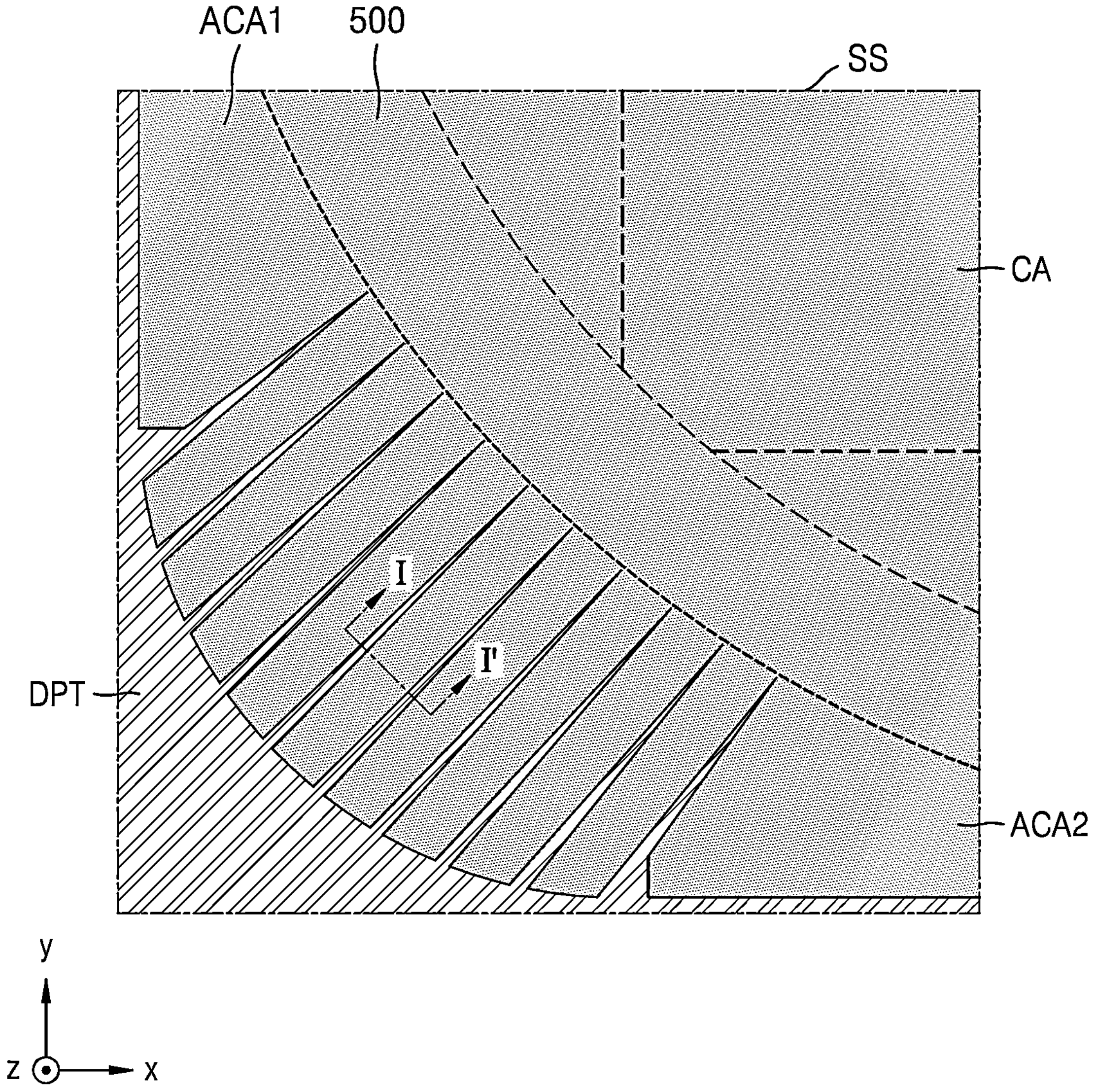
FIG. 12A is a plan view schematically illustrating an embodiment of a method of manufacturing a display apparatus.
Figure 12B:
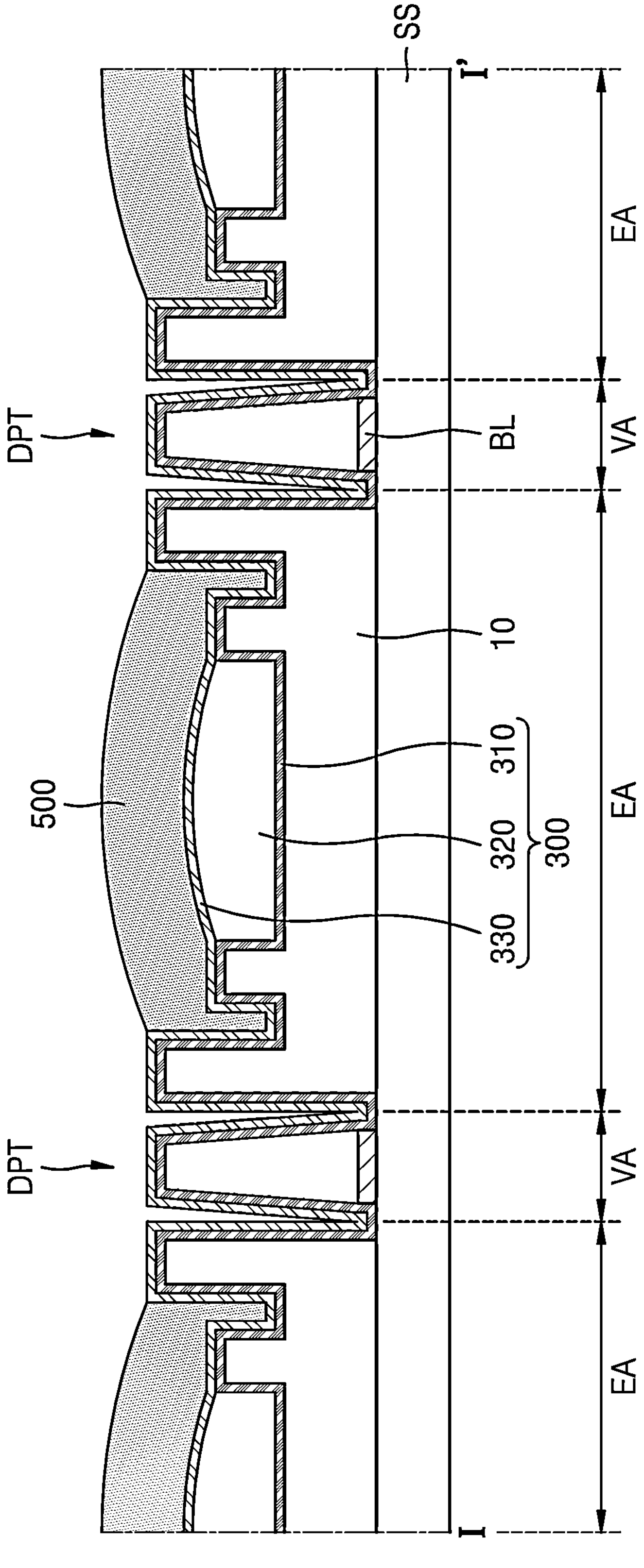
FIG. 12B is a cross-sectional view taken along line I-I' of FIG. 12A.

FIG. 12A is a plan view schematically illustrating an embodiment of a method of manufacturing a display apparatus. FIG. 12B is a cross-sectional view taken along line I-I' of FIG. 12A.

Referring to FIGS. 12A and 12B, the resin layer 500 may be disposed on the encapsulation layer 300, in particular, the second inorganic encapsulation layer 330. In an embodiment, the resin layer 500 may be discharged in a droplet state by a jetting method. The resin layer 500 may be discharged in a fine pattern to be coated in the extension area EA by, e.g., at least one of an inkjet, a needle jet, and a needle dispenser. At this time, the resin layer 500 may be coated between the first corner dams CD1 respectively at opposite end portions of each of the plurality of extension areas EA in the width direction of the extension area EA. Accordingly, the resin layer 500 may not overflow into the separation area VA by passing by the first corner dam CD1.

Thereafter, coated droplets for the resin layer 500 may be cured by a curing process. In particular, ultraviolet rays may be irradiated to the coated droplets. In an embodiment, the coated droplets may be cured by being irradiated with ultraviolet rays with a light amount of about 100 millijoule per square centimeter (mJ/cm$^2$) to about 1000 mJ/cm$^2$, for example. In an embodiment, ultraviolet rays having a wavelength of about 300 nm to about 400 nm may be used for light curing. An LED or metal halide may be used as an ultraviolet source. Accordingly, the droplets may be cured to form the resin layer 500. In an embodiment, the resin layer 500 may have a substantially high modulus. In an embodiment, the modulus of the resin layer 500 may be about 0.5 GPa or more and about 3 GPa or less, and more preferably, about 0.8 GPa or more and about 1.5 GPa or less, for example.

In addition, the thickness T (refer to FIG. 8) of the resin layer 500 may be about 70 μm or more and about 110 μm or less, and more preferably about 100 μm. In addition, the resin layer 500 may have a convex thickness between the first corner dams CD1 respectively at opposite end portions of the extension areas EA. By disposing the resin layer 500 on the encapsulation layer 300, a neutral plane may be moved upward to be adjacent to the encapsulation layer 300, in particular, the second inorganic encapsulation layer 330. Accordingly, a stress applied to the display panel 10, in particular, the second inorganic encapsulation layer 330, may be absent, or may be minimized even when being present. In addition, in the extension area EA which is bent, cracks that may be generated in the display panel 10, in particular, the second inorganic encapsulation layer 330, may be prevented.

Figure 13:
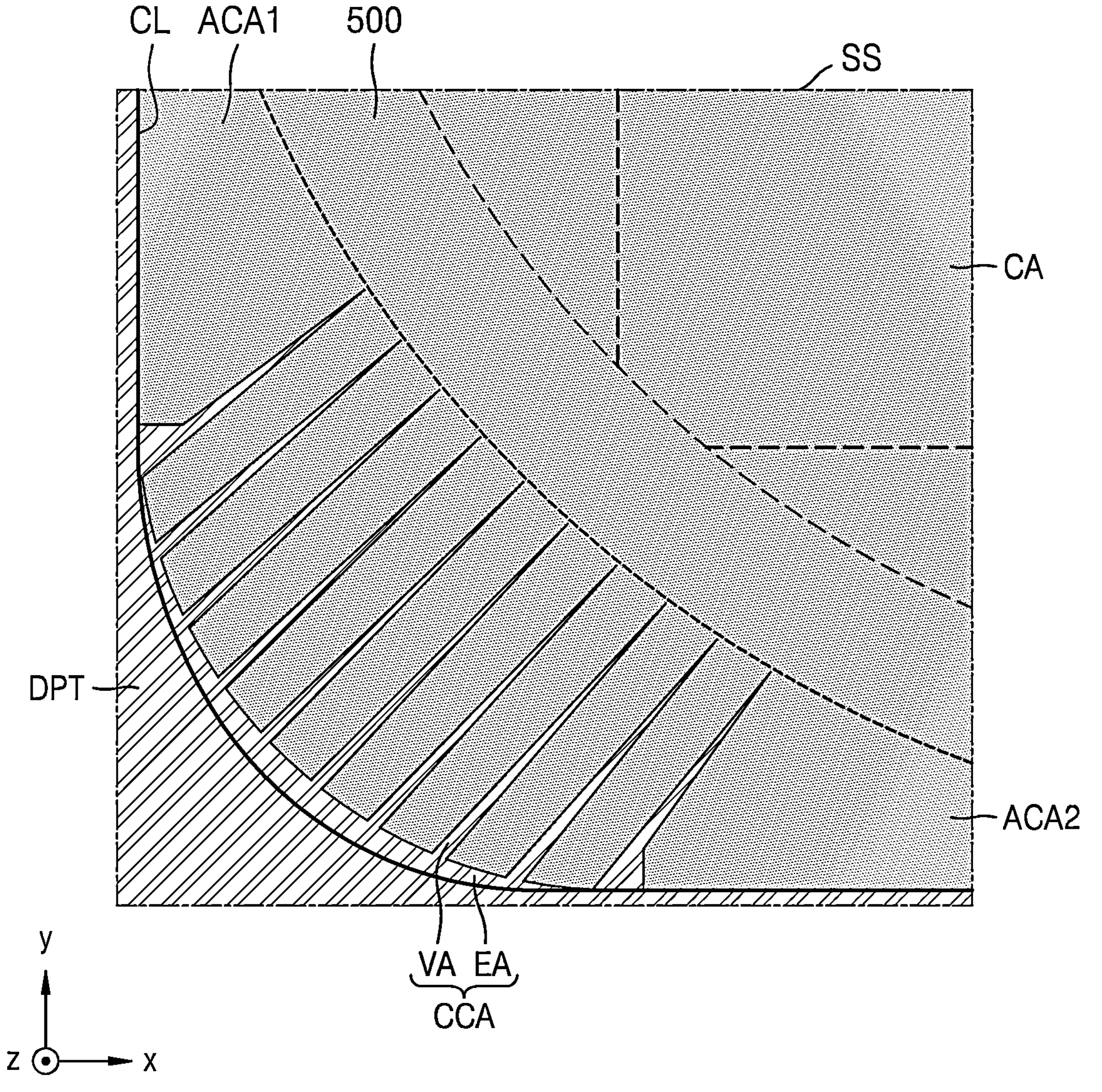
FIG. 13 is a plan view schematically illustrating an embodiment of a method of manufacturing a display apparatus.

FIG. 13 is a plan view schematically illustrating an embodiment of a method of manufacturing a display apparatus.

Referring to FIG. 13, the stacked body 20, the encapsulation layer 300, and the resin layer 500 may be cut by a laser. In particular, the stacked body 20, the encapsulation layer 300, and the resin layer 500 may be cut along a cutting line CL extending along the periphery of the first adjacent corner area ACA1, the central corner area CCA, and the second adjacent corner area ACA2. Accordingly, the stacked body 20, the encapsulation layer 300, and the resin layer 500 may be cut to the size of a cell. At this time, the dummy pattern DPT arranged outside the first adjacent corner area ACA1, the central corner area CCA, and the second adjacent corner area ACA2 may be removed, and a portion of the dummy pattern DPT, the portion overlapping the separation area VA, may not be removed.

Figure 14A:
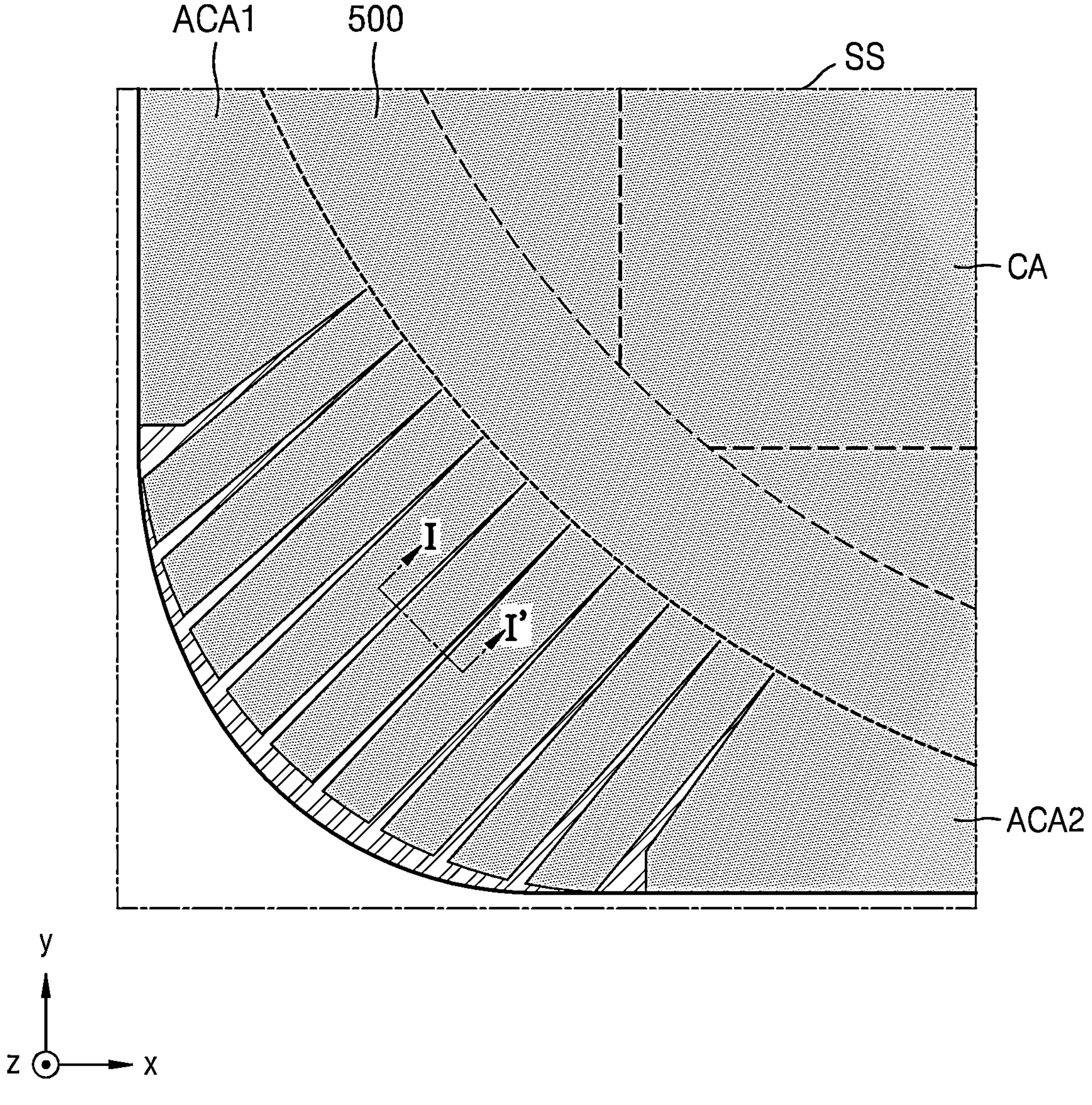
FIG. 14A is a plan view schematically illustrating an embodiment of a method of manufacturing a display apparatus.
Figure 14B:
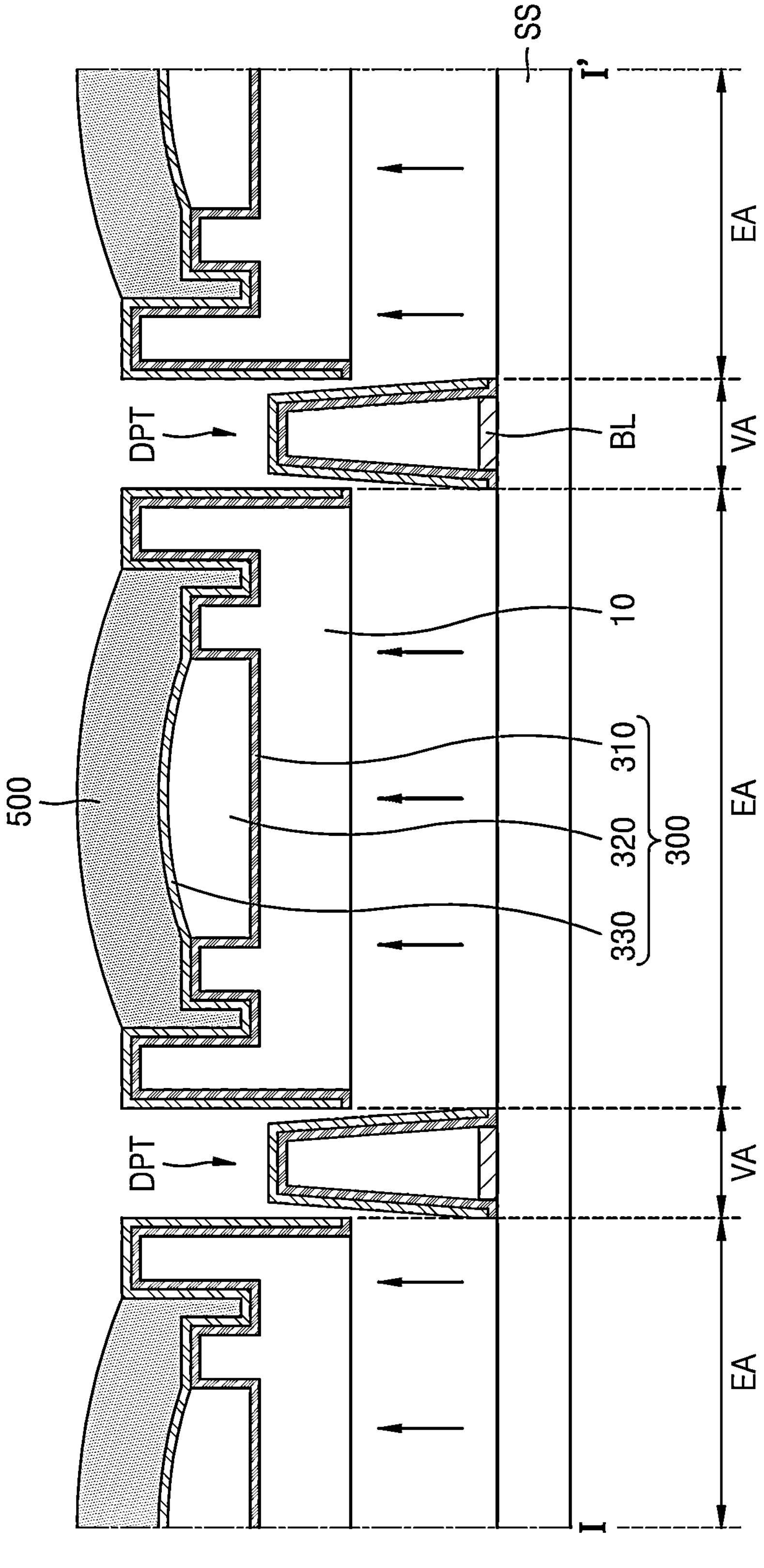
FIG. 14B is a cross-sectional view taken along line J-J' of FIG. 14A.

FIG. 14A is a plan view schematically illustrating an embodiment of a method of manufacturing a display apparatus. FIG. 14B is a cross-sectional view taken along line J-J' of FIG. 14A.

Referring to FIGS. 14A and 14B, the stacked body 20 may be separated from the support substrate SS. In an embodiment, the stacked body 20 may be separated from the support substrate SS according to a laser release method of irradiating a laser to the stacked body 20. The laser may be irradiated in a direction from a lower surface of the support substrate SS to an upper surface of the support substrate SS. As the laser, e.g., an excimer laser having a wavelength of 308 nm, or an ultraviolet ("UV") laser having a wavelength of 343 nm or 355 nm, or the like may be used.

The blocking layer BL is disposed below the dummy pattern DPT, and may absorb the laser. Accordingly, even when the laser is irradiated, the dummy pattern DPT may not be separated from the support substrate SS. The dummy pattern DPT may be removed together with the support substrate SS when the support substrate SS is separated. Accordingly, an area where the dummy pattern DPT was disposed may define the separation area VA as an empty space, and the display panel 10 as described above may be formed.

In addition, referring to FIGS. 13 and 14, in the embodiment, description is made mainly on separating the support substrate SS after cutting the support substrate SS and the stacked body 20 in the size of a cell, but in another embodiment, the support substrate SS may be first separated from the stacked body 20, and the remaining stacked body 20 may be cut to the size of a cell.

Figure 15:
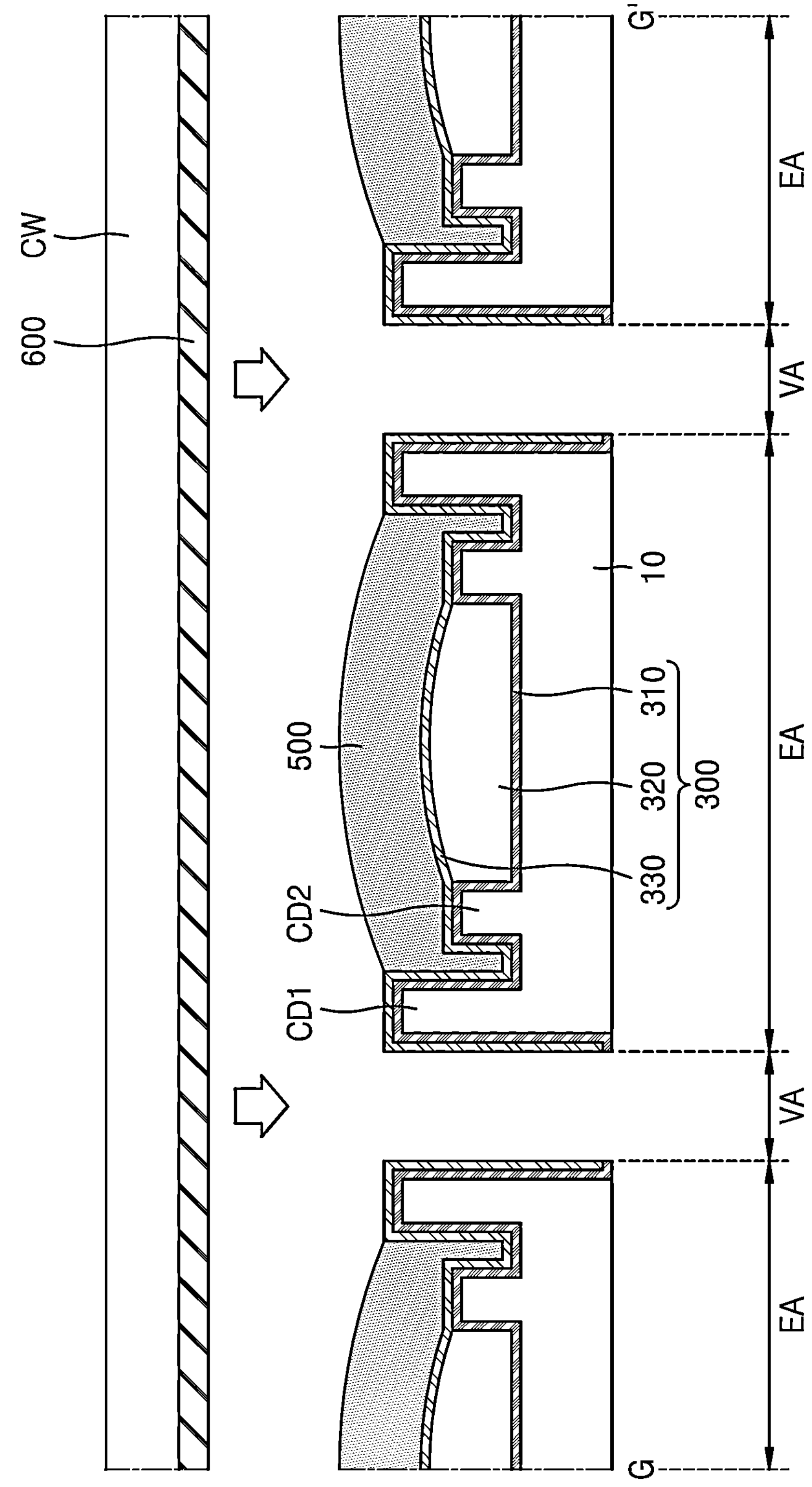
FIG. 15 is a cross-sectional view schematically illustrating an embodiment of a method of manufacturing a display apparatus.

FIG. 15 is a cross-sectional view schematically illustrating an embodiment of a method of manufacturing a display apparatus.

Referring to FIG. 15, the cover window CW may be bonded to the display panel 10. At this time, the cover window CW may be bonded to the resin layer 500 by the adhesive layer 600 between the cover window CW and the resin layer 500. In an embodiment, the adhesive layer 600 may be a transparent adhesive member, such as an OCA. In an embodiment, the cover window CW and the adhesive layer 600 may cover the extension area EA and the separation area VA. In other words, the cover window CW and the adhesive layer 600 may overlap the resin layer 500 in the extension area EA. In addition, the cover window CW and the adhesive layer 600 may not overlap the resin layer 500 in the separation area VA. The cover window CW and the adhesive layer 600 may be spaced apart from the display panel 10 by the resin layer 500 by a predetermined interval in an amount of the thickness T (refer to FIG. 8) of the resin layer 500. The resin layer 500 may move a neutral plane of a display apparatus upward as described above.

To allow the cover window CW and the adhesive layer 600 to be bonded to the resin layer 500, a plurality of extension areas EA and a plurality of resin layer extension areas 500EA may be bent. At this time, because the separation area VA is between the plurality of extension areas EA and the plurality of resin layer extension areas 5000EA, the plurality of extension areas EA and the plurality of resin layer extension areas 5000EA may be easily bent without interfering with each other, and the cover window CW and the adhesive layer 600 may be bonded to the resin layer 500. In addition, by arranging the resin layer 500, in particular, the resin layer extension area 500EA, a neutral plane is moved upward to be adjacent to the encapsulation layer 300, and accordingly, defects such as cracks due to bending in a display apparatus, particularly the corner CN of the display apparatus, may be prevented.

By embodiments, a display apparatus, in which defects such as cracks may be prevented from occurring, and a method of manufacturing the display apparatus may be implemented.

Effects of the disclosure are not limited to the effects mentioned above, and other effects not mentioned will be clearly understood by one of ordinary in the art from the description of the claims.

It should be understood that embodiments described herein should be considered in a descriptive sense only and not for purposes of limitation. Descriptions of features or advantages within each embodiment should typically be considered as available for other similar features or advantages in other embodiments. While embodiments have been described with reference to the drawing figures, it will be understood by those of ordinary skill in the art that various changes in form and details may be made therein without departing from the spirit and scope as defined by the following claims.

What is claimed is:

1. A display apparatus comprising:
- a display panel comprising:
  - a central area; and
  - a corner area in a corner of the central area, the corner area comprising:
    - a plurality of extension areas each extending in a direction away from the central area, and
    - a separation area between the plurality of extension areas; and
- a resin layer disposed on the display panel, the resin layer comprising a plurality of resin layer extension areas respectively overlapping the plurality of extension areas.

2. The display apparatus of claim 1, wherein the resin layer has a modulus of about 0.8 gigapascal or more and about 1.5 gigapascals or less.

3. The display apparatus of claim 1, wherein the display panel further comprises first corner dams respectively at opposite end portions of each of the plurality of extension areas in a width direction of an extension area of the plurality of extension areas, and
- the resin layer is between the first corner dams.

4. The display apparatus of claim 3, wherein the resin layer has a convex thickness between the first corner dams.

5. The display apparatus of claim 3, wherein the display panel further comprises:
- a display element;
- an encapsulation layer covering the display element and comprising an inorganic encapsulation layer and an organic encapsulation layer; and
- two second corner dams between the first corner dams respectively at the opposite end portions of each of the plurality of extension areas in the width direction of the extension area,
- wherein the organic encapsulation layer is between the two second corner dams.

6. The display apparatus of claim 5, wherein the organic encapsulation layer and the resin layer overlap each other between the two second corner dams in a plan view.

7. The display apparatus of claim 5, wherein the organic encapsulation layer and the resin layer do not overlap each other between each of the first corner dams and a second corner dam of the two second corner dams adjacent to the each of the first corner dams.

8. The display apparatus of claim 1, wherein a thickness of the resin layer is about 70 micrometers or more and about 110 micrometers or less.

9. The display apparatus of claim 1, wherein the resin layer comprises a transparent material.

10. The display apparatus of claim 1, further comprising:
- a cover window disposed on the resin layer; and
- an adhesive layer between the resin layer and the cover window,
- wherein the cover window and the adhesive layer overlap the separation area, and the resin layer does not overlap the separation area.

* * * * *